(12) United States Patent
Woodward, Jr. et al.

(10) Patent No.: US 9,874,613 B2
(45) Date of Patent: Jan. 23, 2018

(54) METHOD AND SYSTEM OF APPARATUSES FOR TESTING UTILITY POWER DEVICES

(71) Applicant: Doble Engineering Company, Watertown, MA (US)

(72) Inventors: Robert Clark Woodward, Jr., Cambridge, MA (US); George Matthew Kennedy, Roseville, CA (US)

(73) Assignee: DOBLE ENGINEERING COMPANY, Watertown, MA (US)

( * ) Notice: Subject to any disclaimer, the term of this patent is extended or adjusted under 35 U.S.C. 154(b) by 0 days.

(21) Appl. No.: 15/457,491

(22) Filed: Mar. 13, 2017

(65) Prior Publication Data

US 2017/0184685 A1    Jun. 29, 2017

Related U.S. Application Data

(63) Continuation-in-part of application No. 15/279,032, filed on Sep. 28, 2016, now Pat. No. 9,632,128, which
(Continued)

(51) Int. Cl.
*G01R 31/02* (2006.01)
*G01R 31/40* (2014.01)
*G01R 31/327* (2006.01)

(52) U.S. Cl.
CPC ......... *G01R 31/40* (2013.01); *G01R 31/3274* (2013.01)

(58) Field of Classification Search
CPC .... G01R 31/40; G01R 31/025; G01R 31/027; G01R 31/14; G01R 31/3272; G01R 31/3274; H01M 10/42; H01M 10/48
See application file for complete search history.

(56) References Cited

U.S. PATENT DOCUMENTS 4,241,306 A    12/1980  Bump
5,396,172 A     3/1995  Lat
(Continued)

FOREIGN PATENT DOCUMENTS

GB    2 192 464 A    1/1998
GB    2 411 733 A    9/2005
(Continued)

OTHER PUBLICATIONS

Doble Engineering Company, "Doble Test Procedures", Copyright 2000.
(Continued)

*Primary Examiner* — Minh N Tang
(74) *Attorney, Agent, or Firm* — Brinks Gilson & Lione

(57) ABSTRACT

Test measurements on a utility power device by a switch matrix apparatus and a common voltage source as separate devices is performed. Through the switch matrix apparatus, the common voltage source selectively sends a first high voltage signal via a first lead to a first terminal of the utility power device, measures a first corresponding signal returned via a second lead of the switch matrix apparatus from a second terminal of the utility power device. While the first lead and the second lead of the switch matrix apparatus remain electrically coupled to the first and the second terminal of the utility power device, a second high voltage signal is selectively sent via the second lead to the second terminal of the utility power device, and a second corresponding signal returned from the first terminal of the utility power device via the first lead of the switch matrix apparatus is measured.

30 Claims, 13 Drawing Sheets

Related U.S. Application Data is a continuation of application No. 14/071,207, filed on Nov. 4, 2013, now Pat. No. 9,482,712.

(60) Provisional application No. 61/722,547, filed on Nov. 5, 2012.

(56) References Cited

U.S. PATENT DOCUMENTS

| | | | |
|---|---|---|---|
| 5,455,506 A | 10/1995 | Mimeault | |
| 6,445,196 B1 | 9/2002 | White | |
| 7,026,822 B1 | 4/2006 | Bald | |
| 7,565,253 B2 | 7/2009 | Ewers | |
| 8,466,690 B2 * | 6/2013 | Stewart | G01R 31/1272 324/551 |
| 2004/0124860 A1 | 7/2004 | Hamdan | |
| 2010/0026312 A1 | 2/2010 | Buxkemper | |
| 2012/0019962 A1 | 1/2012 | Faxvog | |
| 2012/0139555 A1 | 6/2012 | Mayfield | |

FOREIGN PATENT DOCUMENTS

| | | |
|---|---|---|
| WO | PCT/2002/035248 A1 | 5/2002 |
| WO | WO 2014/071293 A1 | 5/2014 |

OTHER PUBLICATIONS

IEEE Std C57.12.90, "IEEE Standard Test Code for Liquid Immersed Distribution, Power, and Regulating Transformers", Oct. 15, 2010.
Written Opinion for PCT/US2013/068273, dated Mar. 28, 2014.
International Search Report for PCT/US2013/068273, dated Mar. 28, 2014.
Patent Examination Report No. 1 received in Australian Patent No. 2013337365 dated Aug. 3, 2016.
Supplementary European Search Report received in Application No. 13851883.2—1568/2914969 dated Jun. 6, 2016.
International Preliminary Report on Patentability for PCT/US2013/068273, completed Sep. 28, 2014.
Mexican Patent Office Official Communication No. 27244 dated Apr. 13, 2016.

* cited by examiner

US 9,874,613 B2

METHOD AND SYSTEM OF APPARATUSES FOR TESTING UTILITY POWER DEVICES

RELATED APPLICATIONS

This application is a Continuation-In-Part (CIP) of U.S. application Ser. No. 15/279,032, filed on Sep. 28, 2016 now U.S. Pat. No. 9,632,128 (titled: Method and Apparatus For Testing Utility Power Devices), which is a continuation of U.S. application Ser. No. 14/071,207, filed on Nov. 4, 2013 now U.S. Pat. No. 9,482,712 (titled: Method and Apparatus For Testing Utility Power Devices), which claims the benefit of priority to U.S. Provisional Application No. 61/722,547, filed Nov. 5, 2012, the contents of all of the above are hereby incorporated by reference in their entirety.

FIELD OF THE TECHNOLOGY

The present application relates to utility power test equipment and system. More specifically, the present application relates to method and system of apparatuses for testing utility power devices.

INCORPORATION BY REFERENCE

To assist the reader understanding of the scope of the technology and testing procedures, the "Doble Test Procedures" (Doble Engineering Company's Publication Number 500-0397, document 72A-2244 Rev A) and the IEEE Standard Test Code for Liquid-immersed Distribution, Power and Regulating Transformers (IEEE Std C57.12.90-2010), are incorporated by reference in its entirety as part of the disclosure.

BACKGROUND

Utility power devices, such as circuit breakers, oil filled power and distribution transformers, transformer bushings, substation transformers, oil filled voltage regulators, vacuum breakers and reclosers, coupling capacitors, surge arresters, to name a few, operate in high voltages, which are upward of 10 kV and sometimes more than 69 kV. These utility power devices are frequently installed together with other high voltage devices having exposed terminals. Many of these utility power devices may be installed in an outdoor environment, on an elevated platform surrounded by high voltage transmission line cables, or these utility power devices may be obstructed by tree branches or by other utility power devices. Therefore, the ease or their access by the field workers is greatly limited.

In addition, performing routine maintenance checks or fault diagnostics may require testing the utility power devices in both low voltages (under 500V) and high voltages (>500V, typically 1 kV to 15 kV), which may require multiple connecting, disconnecting or reconnecting of both high voltage cables and low voltage cables to the different terminals of the utility power devices. As mentioned above, these utility power devices may be installed in an environment that is hard to access. It is also difficult for the worker to carry the heavy test apparatus to within reach of the utility power devices to conduct the test routines.

For example, FIG. 1A depicts the performance of an exemplary test measurement on a utility power device (150) in a related art method, using a low voltage lead (124) and a high voltage lead (134). The illustrated utility power device (150) may be an oil filled three-phase power transformer.

The utility power device (150) may include two sets of voltage windings, namely, high voltage windings (156) (Delta-connected transformer windings) and low voltage windings (166) (Wye-connected transformer windings). The high voltage windings (156) receive or output a higher voltage than the low voltage windings (166).

The high voltage windings (156) are wound on three nodes (H1A, H2A and H3A) with each of the three nodes (H1A, H2A and H3A) being 120 degrees out of phase from each other. Likewise, the low voltage windings (166) are wound on three nodes (X1A, X2A and X3A) with each of the three nodes (X1A, X2A and X3A) being 120 degrees out of phase from each other. In addition, the low voltage windings (166) include a neutral node X0A. The currents of the nodes H1A, H2A and H3A on the high voltage windings (156) may return via respective nodes X1A, X2A and X3A of the low voltage windings (166). The operating principle and manner of construction of a three-phase power transformer are generally known in the art.

Each of the nodes (H1A, H2A and H3A) in the high voltage windings (156) may be electrically coupled to respective high voltage bushings (H1, H2 and H3) as external terminals. Likewise, each of the nodes (X0A, X1A, X2A and X3A) in the low voltage windings (166) may be electrically coupled to respective low voltage bushings (X0, X1, X2 and X3) as external terminals. Each bushing is constructed to include a center conductor (e.g., 171) overlayed with multilayer dielectric insulating materials, thus forming a capacitive bushing (e.g., H1). The bushings are rated for high voltage operations (>69 kV), and may be hermetically sealed to protect the center conductor and the multilayer insulating dielectric materials from exposure to the ambient atmosphere, which may cause degradation and shortening of their service life. Water shed discs (178) are formed on the bushing to help divert rain, snow or to help dissipate heat.

In addition, a tap electrode (e.g., Tp1, Tp2 or Tp3) is located at the base of the bushing (H1, H2 or H3) to provide electrical contact for evaluation of the integrity of the multilayer insulating dielectric materials within the bushing. The tap electrode (e.g., Tp1, Tp2 or Tp3) is normally covered, and the cover may be grounded to the chassis of the utility power device (150). The grounded cover may be removed to expose the tap electrode (Tp1, Tp2 or Tp3) to facilitate electrical contact with the tap electrode at the time of testing. More details about the electrical model of the bushing and the testing may be found in chapter three of the "Doble Test Procedures", which is incorporated by reference.

An exemplary apparatus (100) for performing multiple test measurements on the utility power device (150) is illustrated in FIG. 1A. The exemplary apparatus (100) includes a processor (112), which executes instruction code stored in at least one memory (113). The processor (150) may also execute an application (117) stored in the memory (113) to carry out the test routines on the utility power device (150). The processor (112) may also configure a switch matrix (118) to perform operations such as the sourcing of low voltage signals (e.g., <500V, typically up to 250V) via anyone of ports LVS1 (122a) to LVSn (122n), and the sourcing of high voltage signals (e.g., >500V, typically 1 kV to 15 kV) via port HV (132).

Return signals from high voltage excitation or low voltage excitation test measurements may be received via a low voltage lead (124) to anyone of the low voltage measurement ports LVM1 (123a) to LVM 3 (123c). In addition, a ground lead (126) from the TEST-GND port (121) of the apparatus (100) may be electrically coupled to the chassis ground (168) of the utility power device (150) to measure return ground currents of the utility power device (150).

Depending on the type of test measurement, currents measured from the low voltage lead (124) and from the ground lead (126) may be summed together by the apparatus (100). In certain test measurements, the TEST-GND port (121) or one of the low voltage measurement ports LVM1 (123*a*) to LVM 3 (123*c*) may be selectively routed internally by the switch matrix (118) to a guard point (128) within the apparatus as a by-pass current return path (i.e., the by-pass currents will not be measured). The guard point (128) signifies one or more conducting elements as return nodes internally connected on the apparatus (100), which may be used by the measurement unit (115) to divert (i.e., by-pass) unwanted currents from the measurements.

FIG. 1A also illustrates an exemplary test setup for conducting test measurements on the utility power device (150), such as a power factor (PF) test in the related art. The power-factor test measurement is specified in section 10.10.4 of the IEEE Std C57.12.90-2010. Power factor test measurements performed on the utility power device (150) at the factory are compared with power factor test measurements performed at the field to assess a probable condition of the internal insulation within the utility power device (150).

The setup in FIG. 1A may also short circuit the windings in both the high voltage windings (156) and the low voltage windings (166) to eliminate winding inductance when measuring internal insulation of the utility power device (150). The short circuiting may be achieved by using a conductive bus wire (174) to short circuit the conductors (171, 172 and 173) of the high voltage bushings (H1, H2 and H3), and using a conductive bus wire (184) to short circuit the conductors (180, 181, 182 and 183) of the low voltage bushings (X0, X1, X2 and X3), respectively.

Unless otherwise stated, it is understood that prior to the start of any test measurements in this disclosure, the apparatus (100) and the utility power device (150) are both electrically grounded to a common ground (i.e., an earth ground by default).

Section 10.10.4 of the IEEE Std C57.12.90-2010A specifies a typical power factor test on an oil filled two winding transformer, such as the utility power device (150) illustrated in FIG. 1A. Using the related art method, the complete power factor test may be carried out via a first procedure (see FIG. 1A) and a second procedure (see FIG. 1B). The order in which the two procedures are performed is unimportant. The first procedure may be performed on the high voltage winding side (156), and the second procedure may be performed on the low voltage winding side (166).

The first procedure may be carried out with the following exemplary steps:
(1) Placing the high voltage lead (134) on the bus wire (174) of the high voltage windings (156) (i.e., to all three terminals on the Delta-connected transformer windings), placing the low voltage lead (124) on the bus wire (184) of the low voltage windings (166) (to all three terminals on the Wye-connected transformer windings), and electrically coupling the TEST-GND port (121) of the apparatus (100) to the chassis ground (168) of the utility power device (150) via the ground lead (126).
   (a) Configuring the switch matrix (118) to connect the low voltage lead (124) to TEST-GND port (121) (i.e., by routing the low voltage measure port LVM1 (123*a*) to the TEST-GND port (121)).
   (b) Configuring measurement unit (115) to measure current to the TEST-GND port (121) (i.e., measuring electrical parameters on both the current from the ground lead (126) and the low voltage lead (124) via port LVM1 (123*a*)).
   (c) Sending or applying a high voltage signal (HV) from the high voltage port HV (132) via the high voltage lead (134) to the bus wire (174) of the high voltage windings (156). Measuring the applied high voltage signal (HV), and the current in the measurement unit (115) (i.e., measuring electrical parameters on both the current from the ground lead (126) and the low voltage lead (124)).

(2) Continue with the same leads (124, 134, 126) arrangement for the set up configuration as in FIG. 1A:
   (a) Configuring switch matrix (118) to connect the low voltage lead (124) to GUARD point (128) (i.e., by internally routing the low voltage measure port LVM1 (123*a*) to the GUARD point (128) to by-pass the current in the low voltage lead (124)).
   (b) Configuring measurement unit (115) to measure current to TEST-GND port (121).
   (c) Sending or applying a high voltage signal (HV) from the high voltage port HV (132) via the high voltage lead (134) to the bus wire (174) of the high voltage windings (156). Measuring electrical parameters on the applied voltage (HV), and the current in the measurement unit (115) (i.e., measuring electrical parameters on only the current from the ground lead (126).

(3) Continue with the same leads (124, 134, 126) arrangement for the set up configuration in FIG. 1A:
   (a) Configuring switch matrix (118) to connect TEST-GND port (121) to GUARD point (128) (i.e., by routing the TEST-GND port (121) to the GUARD point (128) to by-pass the current in the ground lead (126)).
   (b) Configuring measurement unit (115) to measure current to the low voltage lead (124).
   (c) Measuring applied voltage (HV), and the current in the measurement unit (115) (i.e., measuring electrical parameters on only the current from the low voltage lead (124)).

The second procedure of the power factor test on the low voltage winding side may be carried out by repeating the identical steps (1) to (3) in the first procedure, using a setup configuration as illustrated in FIG. 1B. The configuration between the setup in FIG. 1A and FIG. 1B are different in that a) the high voltage lead (134) is now connected to the bus wire (184) of the low voltage windings (166), and b) the low voltage lead (124) is now connected to the bus wire (174) of the high voltage windings (156). In other words, a high voltage signal (HV) may be applied from the high voltage port HV (132) via the high voltage lead (134) to the bus wire (184) of the low voltage windings (166), and measurements of electrical parameters may be taken via the low voltage lead (124) on the bus wire (174) of the high voltage windings (156).

It should be noted that the test setup configuration according to both FIGS. 1A and 1B would require the field worker to stop at the completion of steps (1) to (3) to regain access to the utility power device (150) to reverse the high voltage lead (134) and the low voltage lead (124) on the respective bus wires (174, 184). In this regard, the testing time may be lengthened, and the field worker may be exposed to the hazardous high voltage surroundings while attempting to regain access.

The problems above are exacerbated with the test measurements illustrated in FIGS. 1C and 1D. Similar to FIGS.

1A and 1B, the test measurements of FIGS. 1C and 1D may be power factor tests or insulation condition tests on the high voltage bushings (H1 to H3) and on the low voltage bushings (X1 to X3). The test measurements of FIGS. 1C and 1D may be viewed as two separate procedures of a complete test routine. More specifically, FIG. 1C represents a test setup configuration in a related art method, using a low voltage lead and a high voltage lead to measure the power factor of each of the high voltage bushings (H1, H2 and H3) and the low voltage bushings (X1, X2 and X3) on the utility power device (150).

The setup configuration in FIG. 1C may be similar to FIG. 1A in many aspects, including: short circuiting of both the high voltage windings (156) and the low voltage windings (166) to eliminate winding inductance when measuring internal insulation of the high voltage bushings (H1, H2 and H3) and the low voltage bushings (X1, X2 and X3), using the conductive bus wires (174 and 184) for the high voltage bushings (H1, H2 and H3) and the low voltage bushings (X0, X1, X2 and X3), respectively. Prior to the start of the test measurements, the apparatus (100) and the utility power device (150) are both electrically grounded to a common ground (i.e., an earth ground by default).

A typical power factor test performed on the high voltage bushing (H1, H2 and H3) in the related art may be carried out as with the following steps:

(1) Placing the high voltage lead (134) on the bus wire (174) of the high voltage windings (156) (i.e., to all three terminals on the Delta-connected transformer windings), connecting the low voltage lead (124) to the tap electrode (Tp1) of bushing H1, and electrically coupling the TEST-GND port (121) of the apparatus (100) to the chassis ground (168) of the utility power device (150) via the ground lead (126).

(a) Configuring switch matrix (118) to connect TEST-GND port (121) to GUARD point (128) (i.e., by internally routing the TEST-GND port (121) to the GUARD point (128) to by-pass the current in the ground lead (126)).

(b) Configuring measurement unit (115) to measure current to the low voltage lead (124).

(c) Measuring applied voltage (HV), and the current in the measurement unit (115) (i.e., measuring only the current returned from the low voltage lead (124)).

(2) Continue with the same leads (134, 126) arrangement for the set up configuration as in FIG. 1C, except connecting the low voltage lead (124) to the tap electrode (Tp2), and repeat the same tests (1a-1c) for the bushing (H2).

(3) Continue with the same leads (134, 126) arrangement for the set up configuration as in FIG. 1C, except connecting the low voltage lead (124) to the tap electrode (Tp3), and repeat the same tests (1a-1c) for the bushing (H3).

(4) Placing the low voltage lead (124) on the bus wire (174) of the high voltage windings (156) (i.e., to all three terminals on the Delta-connected transformer windings), connecting the high voltage lead (134) to the tap electrode (Tp1) of bushing H1, and electrically coupling the TEST-GND port (121) of the apparatus (100) to the chassis ground (168) of the utility power device (150) via the ground lead (126).

(a) Configuring switch matrix (118) to connect the low voltage lead (124) to GUARD point (128) (i.e., by internally routing the low voltage lead port (LVM1) (123a) to the GUARD point (128) to by-pass the current in the low voltage lead (124)).

(b) Configuring measurement unit (115) to measure current to the TEST-GND port (121).

(c) Measuring applied voltage (HV), and the current in the measurement unit (115) (i.e., measuring only the current returned from the ground lead (126)).

(5) Continue with the same leads (124, 126) arrangement for the set up configuration as in FIG. 1C, except connecting the high voltage lead (134) to the tap electrode (Tp2), and repeat the same tests (4a-4c) for the bushing (H2).

(6) Continue with the same leads (124, 126) arrangement for the set up configuration as in FIG. 1C, except connecting the low voltage lead (134) to the tap electrode (Tp3), and repeat the same test tests (4a-4c) for the bushing (H3).

It should noted that carrying out steps (1) to (3) requires changing the low voltage lead (124) to the subsequent tap electrode twice. Likewise, carrying out steps (4) to (6) also requires changing the high voltage lead (134) to the subsequent tap electrode twice. Swapping of the various leads (i.e., high voltage lead (134) with the low voltage lead (124) in step (4)) results in at least five interruptions for field worker. That is, the field worker would be exposed to a hazardous high voltage surrounding at least five times.

FIG. 1D depicts the same power factor test measurements on the low voltage bushings (X1 to X3) of the low voltage windings (166) using a similar test setup configuration as in FIG. 1C, except that the high voltage lead (134) is now connected to the bus wire (184) of the low voltage windings (166), and the low voltage lead (124) is now connected to the tap electrode (Tp4) of bushing X1. Accordingly, the second testing procedure of steps (1) to (6) are applicable to the test measurements. That is, there would be at least five interruptions during which the field worker would be exposed to a hazardous high voltage surrounding. Therefore, the field worker is exposed to interruptions and dangerous conditions a total number of ten times in the above test.

The voltage signal sent to the electrode taps (Tp1-Tp6) in carrying out steps (4) to (6) may be carried out at a lower voltage (e.g., 250V). In this regard, the high voltage port (132) may source a lower voltage (e.g., 250V). Alternately, steps (4) to (6) may be carried out using an second low voltage lead sourced by a low voltage port LVS1 (122a) that energizes electrode taps (Tp1-Tp6).

Nevertheless, irrespective of whether the steps (4) to (6) in FIG. 1C or 1D are carried out using the same high voltage lead (134), or alternately using a second low voltage lead sourced by a low voltage port LVS1 (122a) (not shown), the field worker still needs to stop at least ten times to complete both test procedure using the test set up configuration as in FIGS. 1C and 1D.

To summarize, the testing methods of the utility power device using the related art methods are tedious and cumbersome, requiring frequent voltage leads changing in each terminal test measurement and, therefore, frequent interruptions to the workflow takes a longer time to complete. Such frequent voltage leads changing are prone to human errors and accidents due to worker fatigue or limited access to the utility power device especially when the tests need to be performed at night when a power outage takes place. In addition, the exemplary apparatus (100) and the test cables (i.e., test leads) used in the testing are often bulky and quite heavy, they are cumbersome to be carried by a worker to the utility power device under test. Frequent access to the utility power device to change voltage leads increases testing time, even exposes the worker to risks of injuries or even accidental death from electrocution.

SUMMARY

The disclosure addresses improving personnel safety and simplifying testing routines through minimizing cable handling wherein test cables are directly connected to respective output ports of a switch matrix. The switch matrix is disposed between a plurality of common voltage sources and the utility power device under test. In an embodiment, the disclosure illustrates various embodiments of the test method performed by a single test apparatus having integrated common voltage sources and having an integrated switch matrix. In another embodiment, the test method may be performed by a system of multiple apparatuses, which the switch matrix may be a stand-alone portable apparatus external to and detached from the test apparatus having integrated common voltage sources.

It should be noted that unless otherwise specified, throughout the description, the term "apparatus" without a preceding modifier, may be interpreted as a "single device test apparatus" having at least both common voltage sources and a switch matrix integrated into a same housing. Throughout the description, the term "system" may be interpreted as a system formed by multiple separate apparatuses, including: a test apparatus having at least common voltage sources, and an external and separate switch matrix apparatus, wherein the test apparatus may be coupled to the switch matrix apparatus through an interface, and the test apparatus may send control signals and respective voltage signals through the interface to control the switch matrix apparatus and to output the respective voltage signals to the utility power device under test through respective cables connected between the output ports of the switch matrix apparatus and respective terminal of the utility power device under test.

The description discloses various embodiments of a method for performing multiple test measurements on a utility power device. the method perform the steps of: providing a switch matrix apparatus that includes: one or more common voltage source apparatus (CVA) ports configured to be coupled to corresponding ports of a common voltage source apparatus; first and second utility side device (USD) ports configured to be coupled to first and second terminals of utility power device through a corresponding first lead and a second lead; a first low voltage lead configured to be coupled to a third terminal of the utility power device; switch matrix circuitry configured to selectively electrically couple the one or more CVA ports, the first and second USD ports, and the first low voltage lead to one another; a ground node configured to be coupled to a common ground node shared by the common voltage source apparatus and the utility power device; and a processor for controlling the switch matrix circuitry that includes a communication interface for communicating information to the processor; controlling, by the processor and responsive to instructions received via the communication interface, the switch circuitry to selectively couple the first and second USD ports to one of the one or more CVA ports, wherein the one CVA port being configured to be coupled to an internal common high voltage source local to the common voltage source apparatus; wherein the selectively coupling of the first and second USD ports to the one of the one or more CVA ports facilitates the test measurements on the utility power device, comprising: selectively communicating a first high voltage signal from a common voltage source apparatus to the first terminal of the utility power device; measuring by the common voltage source apparatus, respective first electrical parameters across the first terminal and the second terminal of the utility power device as a first corresponding signal returned via the second lead of the switch matrix apparatus which is connected to the second terminal of the utility power device; and simultaneously measuring by the common voltage source apparatus, respective third electrical parameters across the first terminal and the third terminal of the utility power device returned via the first low voltage lead of the switch matrix apparatus which is connected to the third terminal of the utility power device.

In a second embodiment, the description discloses a switch matrix apparatus that includes: one or more common voltage source apparatus (CVA) ports configured to be coupled to corresponding ports of a common voltage source apparatus; first and second utility side device (USD) ports configured to be coupled to first and second terminals of utility power device; a first low voltage lead configured to be coupled to a third terminal of the utility power device through a corresponding first lead and a second lead; switch matrix circuitry configured to selectively electrically couple the one or more CVA ports, the first and second USD ports, and the first low voltage lead to one another; a ground node configured to be coupled to a common ground node shared by the common voltage source apparatus and the utility power device; a processor for controlling the switch matrix circuitry that includes a communication interface for communicating information to the processor; and non-transitory computer readable media that stores instruction code that when executed by the processor, causes the processor to: control the switch matrix circuitry to selectively couple the first and second USD ports to the one of the one or more CVA ports in response to instructions received via the communication interface, the one CVA port being configured to be coupled to an internal common high voltage source local to the common voltage source apparatus; wherein the selectively coupling of the first and second USD ports to the one of the one or more CVA ports facilitates test measurements on the utility power device by: selectively communicating a first high voltage signal from a common voltage source apparatus to the first terminal of the utility power device; measuring by the common voltage source apparatus, respective first electrical parameters across the first terminal and the second terminal of the utility power device as a first corresponding signal returned via the second lead of the switch matrix apparatus which is connected to the second terminal of the utility power device; and simultaneously measuring by the common voltage source apparatus, respective third electrical parameters across the first terminal and the third terminal of the utility power device returned via the first low voltage lead of the switch matrix apparatus which is connected to the third terminal of the utility power device.

While the corresponding first lead, the second lead and the first low voltage lead of the switch matrix apparatus remain electrically coupled to the corresponding first terminal, the second terminal and the third terminal of the utility power device, the method includes the step of selectively sending by the common voltage source apparatus, a second high voltage signal via the second lead of the switch matrix apparatus to the second terminal of the utility power device, measuring by the common voltage source apparatus, respective second electrical parameters across the second terminal and the first terminal of the utility power device as a second corresponding signal returned via the first lead of the switch matrix apparatus which is connected to the first terminal of the utility power device; and simultaneously measuring by the common voltage source apparatus, respective fourth electrical parameters across the second terminal and the third terminal of the utility power device returned via the first low voltage lead of the switch matrix apparatus which is connected to the third terminal of the utility power device.

In an embodiment, the method using the switch matrix apparatus may include: a first switch network having at least one input port and a plurality of corresponding output ports coupled to respective test leads, and the switch matrix circuitry communicates measured voltage signals to the common voltage source apparatus and controls the first switch network via the processor in response to control signals received from the common voltage source apparatus; wherein the common voltage source apparatus includes: at least a local processor executing programmable codes stored in a local memory configuring the common voltage source apparatus to control an internal local high voltage source, an internal local low voltage source, and the switch matrix circuitry of the externally coupled switch matrix apparatus.

In an embodiment, the method using the switch matrix apparatus the selectively sending of the first high voltage signal and the second high voltage signal and the measuring of the respective electrical parameters corresponding to the first and the second return signals, including: internally switching by the switch matrix apparatus, a corresponding first and second switch network, each having a plurality of high voltage relays and at least one switch, wherein the internal switching include: connecting the first lead and the second lead to a first port on the switch matrix apparatus corresponding the first switch network and a second port on the switch matrix apparatus corresponding the second switch network of the switch matrix apparatus, respectively; controlling by the common voltage apparatus, the first switch network and the second switch network via a corresponding first switching logic and a second switching logic, respectively; and electrically coupling the corresponding first switch network and the second switch network to the internal common high voltage source via a corresponding first plurality of high voltage relays and a second plurality of high voltage relays, respectively, wherein the corresponding first plurality of high voltage relays and the second plurality of high voltage relays are each controlled by a corresponding first relay logic and a second relay logic of the common voltage apparatus, respectively, in order to selectively output one of: the first high voltage via the first lead, the second high voltage via the second lead, or simultaneously sending the first and the second high voltage via the first and the second lead of the switch matrix apparatus.

The method using the switch matrix apparatus may further include coupling a second low voltage lead of the switch matrix apparatus to a fourth terminal of the utility power device; outputting by an internal low voltage source of the common voltage apparatus, a common low voltage signal to the third terminal of the utility power device via the first low voltage lead of the switch matrix apparatus, wherein the internal low voltage source and the internal common high voltage source utilize a third switch network of the switch matrix apparatus which is separate and different from the first switch network for sending the first and second high voltage signals and for receiving the respective first and second corresponding signals returned via the first lead and the second lead of the switch matrix apparatus; and simultaneously measuring respective fifth electrical parameters across the third terminal and the fourth terminal of the utility power device returned via the second low voltage lead of the switch matrix apparatus which is connected to the fourth terminal of the utility power device.

The method using the switch matrix apparatus may further include: utilizing one or more additional switch network and one or more additional leads from the switch matrix apparatus for sending one or more additional high voltage signals to one or more additional terminals of the utility power device, or for receiving a corresponding one or more additional return signals from the utility power device in measuring a corresponding one or more additional electrical parameters, coupling both the first lead and the second lead of the switch matrix apparatus to the internal common high voltage source, and simultaneously sending a high voltage signal via the first lead and the second lead of the switch matrix apparatus to a first and a second terminal of the utility power device; and measuring by the common voltage source apparatus, the corresponding first and the second return signals via at least one or both of the first and a second low voltage leads of the switch matrix apparatus which are coupled between at least one or both of the third and a fourth terminals of the utility power device.

The method using the switch matrix apparatus may include coupling the one or more CVA ports of the switch matrix apparatus to corresponding ports of two or more respective separate common voltage source apparatuses through respective communication interfaces, such that each of the two or more common voltage source apparatuses each simultaneously and independently communicates with and controls the switch matrix apparatus in order to perform multiple test measurements on the utility power device directly through the switch matrix apparatus, and wherein the switch matrix apparatus simultaneously performs multiple test measurements on two or more respective utility power devices through controlling the switch matrix apparatus through the respective communication interfaces which are directly coupled to the two or more respective separate common voltage source apparatuses.

The apparatus for performing test measurements on various utility power devices and the method for using the apparatus are merely exemplary. Other electrical devices not classified under the utility power device category may also be tested using the method by the apparatus. In addition or alternatively, the apparatus may be adapted to test other electrical devices. Such adapted apparatuses are understood to fall within the scope of the claims. In addition, the disclosed methods may be implemented in many different permutations, and the test measurements may be performed in other sequences according to the knowledge of those who possesses ordinary skills in the art.

BRIEF DESCRIPTION OF THE DRAWINGS

The accompanying drawings are included to provide a further understanding of the claims. The drawings are incorporated in, and constitute a part of this specification. The detailed description and illustrated embodiments described serve to explain the principles defined by the claims.

DETAILED DESCRIPTION OF THE EMBODIMENTS

Described below is a test apparatus (or alternately a system of apparatuses) that overcomes the problems inherent with known utility power device apparatus and the procedures for using the same. Generally, the test apparatus (or alternately a system of apparatuses) has a number of ports that are coupled to a utility power device (or more than one utility power devices). Depending on a test to be performed, the test apparatus (or system) automatically reconfigures the ports to be either inputs or outputs. The test apparatus (or alternately a system of apparatuses) also outputs various voltages to those ports configured as outputs and measures signals received from those ports configured as inputs. This automatic reconfiguring of the ports frees the operator from having to switch leads back and forth, which is required with known test equipment.

Figure 1A:
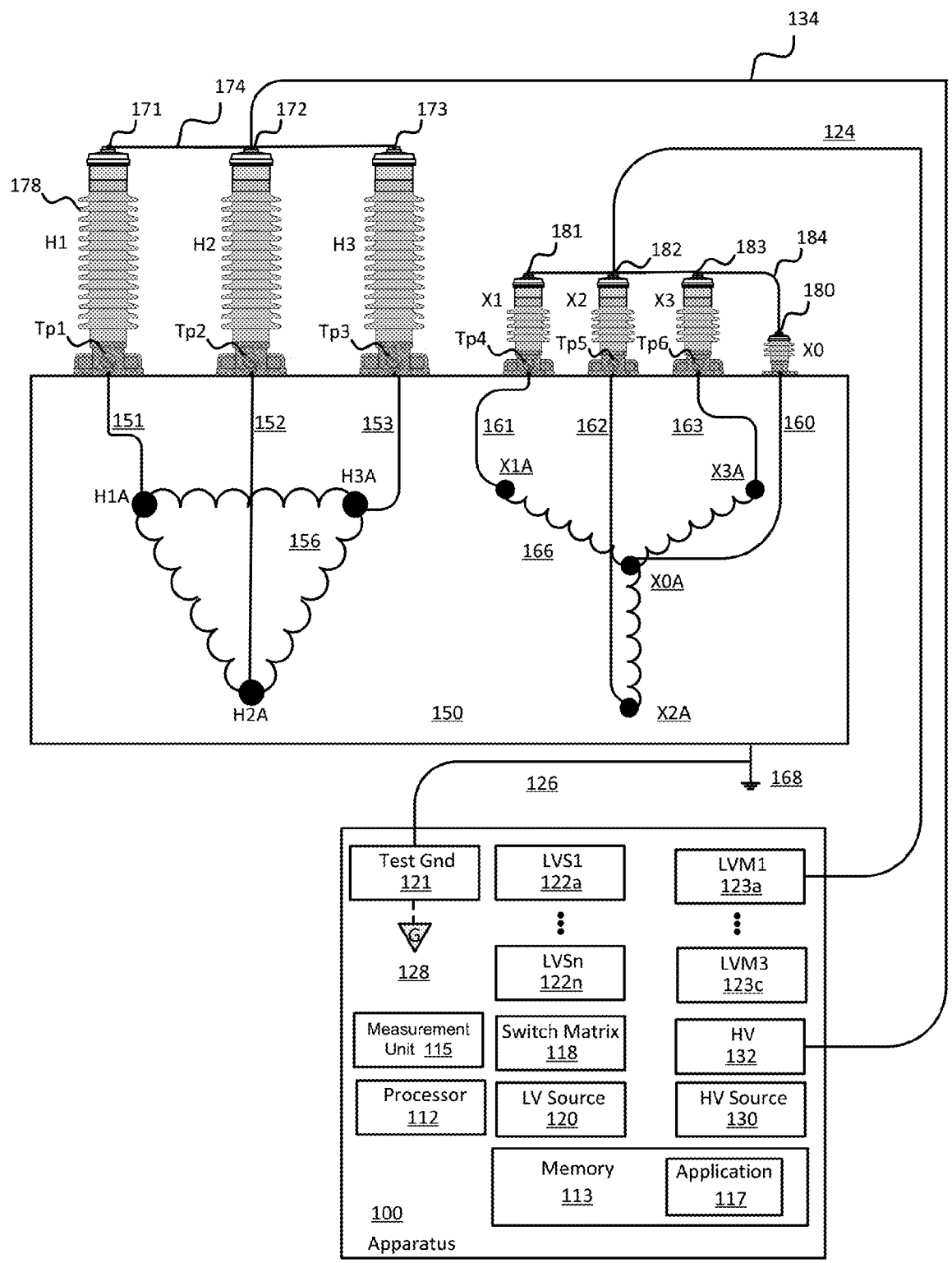
FIG. 1A illustrates an exemplary test measurement on a utility power device in a related art method, using a low voltage lead and a high voltage lead.
Figure 2A:
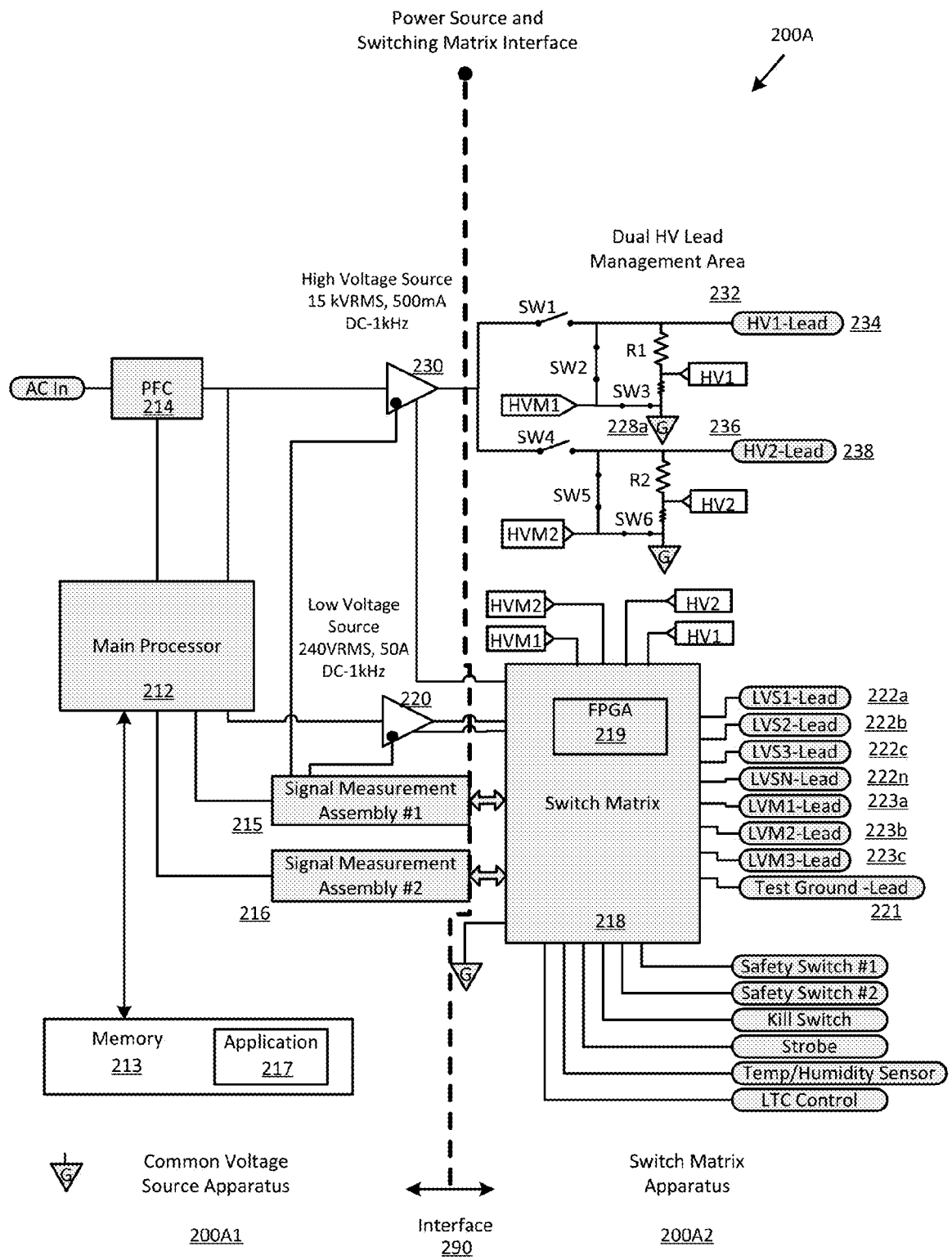
FIG. 2A illustrates an exemplary schematic block diagram of an apparatus (or alternately a system of apparatuses) used for test measurements on a utility power device using two high voltage leads, according to an embodiment.

FIG. 2A illustrates an exemplary schematic block diagram apparatus (or alternately a system of apparatuses) (200A) for performing measuring characteristics of a utility power device. In an embodiment, the apparatus (200A) (or system) includes two high voltage leads HV1 (234) and HV2 (238) that couple the apparatus (200A) (or system) to the utility power device. The apparatus (200A) also includes a main processor (212), switch matrix (218), a memory (213), low voltage leads LVS1 to LVSN (222a-222n), low voltage measurement leads LVM1 to LVM3 (223a-223c), and a test ground lead (221)) which may perform similar functions as those already described in FIG. 1A.

Instruction code for controlling the apparatus (200A) (or system) is stored in the memory (213) and is operable to cause the apparatus (200A) (or system)) to perform the test routines of the various embodiments disclosed in the application, which includes controlling the configuration of the two high voltage leads HV1 (234) and HV2 (238) and controlling the logic for switching a plurality of switch networks (SW1/SW2/SW3 and SW4/SW5/SW6), where each switch network may comprise a plurality of high power relays.

With regard to FIG. 2A, the apparatus (200A) (or system) may include a dual high voltage lead management area (232) for selectively sending or applying a first high voltage signal (HV1) and a second high voltage signal (HV2) for selecting the measurements of respective electrical parameters in first and second return signals, which correspond to the applied first high voltage signal (HV1) and the second high voltage signal (HV2), respectively. The dual high voltage lead management area (232) may include at least a first switch network (SW1/SW2/SW3) and a second switch network (SW4/SW5/SW6). The first switch network (SW1/SW2/SW3) may include at least two high power relays SW1 and SW2, and at least a low power switch SW3. The second switch network (SW4/SW5/SW6) may include at least two high power relays SW4 and SW5, and at least a low power switch SW6.

In addition, the first and the second switch network may each include corresponding high precision impedance components (Z1, Z2), respectively. The high precision impedance components (Z1, Z2) may be made from materials having resistive (i.e., resistors) or reactive characteristics (i.e., capacitors and/or inductors), or having any combination of both. The high precision impedance components (Z1, Z2) facilitate sampling of the corresponding first and the second high voltage signals (HV1, HV2), and may facilitate measurements of electrical parameters in the corresponding first and second return signals. The high precision impedances (Z1, Z2) may be manufactured with minimal phase shift in mind to achieve high precision in phase angle measurements. In addition, the high precision impedances (Z1, Z2) may each function as a voltage divider dropping impedance to lower the sampled HV1 and HV2 voltages and the current to a level sufficiently safe for measurements without causing damage to the signal measurement assemblies (215, 216).

The first switch network (SW1/SW2/SW3) and the second switch network (SW4/SW5/SW6) may each be controlled by respective first and second switching logic through nodes (HVM1, HVM2). The nodes (HVM1, HVM2) are each coupled to the switch matrix (218).

The apparatus (200A) (or system) may include a common high voltage source (230) for outputting or generating a wide range of high voltage signals (up to 15 kVRMS). In addition, the high voltage signals may include both a direct current (DC) signal as well as alternating current (AC) signals with a frequency range from DC to at least 1 kHz. The high voltage signals are digitally synthesized and generated using inputs from a power factor converter (PFC) (214) and from a signal measurement assembly (215). In addition, the common high voltage source (230) is connected to the corresponding first switch network and the second switch network to facilitate selectively sending at least the first and the second high voltage signals HV1 or HV2 to the utility power device (as shown in FIGS. 3A to 3F). Alternately, the common high voltage source (230) may simultaneously send the first and the second high voltage signals (HV1, HV2) via both high voltage leads (234, 238) to the utility power device to facilitate various test measurements on the utility power device.

The apparatus (or system) (200A) may include a common low voltage source (220) for outputting or generating a wide range of low voltage signals (up to 250 VRMS). Similar to the common high voltage signal source (230), the common low voltage source (220) may include both direct current (DC) and alternating current (AC) signals, that can operate over a frequency range from DC to at least 1 kHz. The low voltage signals are digitally synthesized and generated using inputs from a power factor converter (PFC) (214) and from a signal measurement assembly (215). In addition, the common low voltage source (220) is connected to the switch matrix (218) to facilitate selectively sending one or more low voltage signals through low voltage leads (LVS1 to LVS3) to at least the first and the second high voltage signals HV1 or HV2. Alternately, the common low voltage source (220) may send a plurality of low voltage signals simultaneously through low voltage leads LVS1 to LVS3 to facilitate testing of the utility power device.

Exemplary operations performed by the first and second switch networks in facilitating a typical test measurement on a utility power device, using the two high voltage leads (234, 238) are described below. The operations include:
  Connecting of the two HV leads (234, 238) to an appropriately prepared test specimen (i.e., a utility power device)
  Closing SW1 and opening SW2 and SW3, which facilitates sending of high voltage signal HV1 via a first high voltage lead (234))
  Opening SW4 and SW6, and closing SW5, which facilitates the use of the second high voltage lead (238) as a measurement lead.
  Repeating the above steps using different voltages or frequencies, or using different switch matrix (218) via operations that include:
    Setting switch matrix (218) appropriately
    Ramping the common high voltage source (230) to the next test voltage at the initial frequency
    Making another measurement via the second high voltage lead (238), and/or via a Test Ground lead (221), or in combination with an additional low voltage lead (one of LMV1 (223a) to LMV3 (223c))
  The operations continue with ramping of the voltage HV1 down to zero
  Ramping the high voltage source (230) to the test voltage HV1 at a next frequency
    Making another measurement (via high voltage lead (238) and/or via Test Ground lead (221), or in combination with an additional low voltage lead (one of LMV1 (223a) to LMV3 (223c))
  Ramping the voltage HV1 down to zero
  Reporting measurement results to the apparatus (or system) (200A) or to a computing device
  Repeat the above test with different switch matrix settings.
  Closing SW4, and opening SW5 and SW6, which facilitates sending of high voltage signal HV2 via a second high voltage lead (238).
  Opening SW1 and SW3, closing SW2, which facilitates using high voltage lead (234) as a measurement lead
  Repeating the same tests of HV1 in the above measurements with different switching matrix settings, voltage range and frequency range.

The description of the above exemplary steps and operations may equally be implemented by using a system formed by a common voltage source apparatus (200A1), and a separate switch matrix apparatus (200A2) as shown in FIG. 2A. The common voltage source apparatus (200A1) may comprise the high voltage source (230), the low voltage source (220), the main processor (212), the memory (213) storing program codes as the application (217), signal measurement assembly 1 (215) and signal measurement assembly 2 (216). The switch matrix apparatus (200A2) may comprise the first switch network (SW1/SW2/SW3) and the second switch network (SW4/SW5/SW6) which is controlled by the switch matrix (218). The switch matrix (218) may have its own processor (i.e., FPGA 219). The common voltage source apparatus (200A1) may be coupled to the switch matrix apparatus (200A2) through an interface (290), Details of operations may be further described in the various embodiments of FIGS. 3A to 3F, and the steps of operations may be summarized by a flow chart in FIG. 4.

Figure 2B:
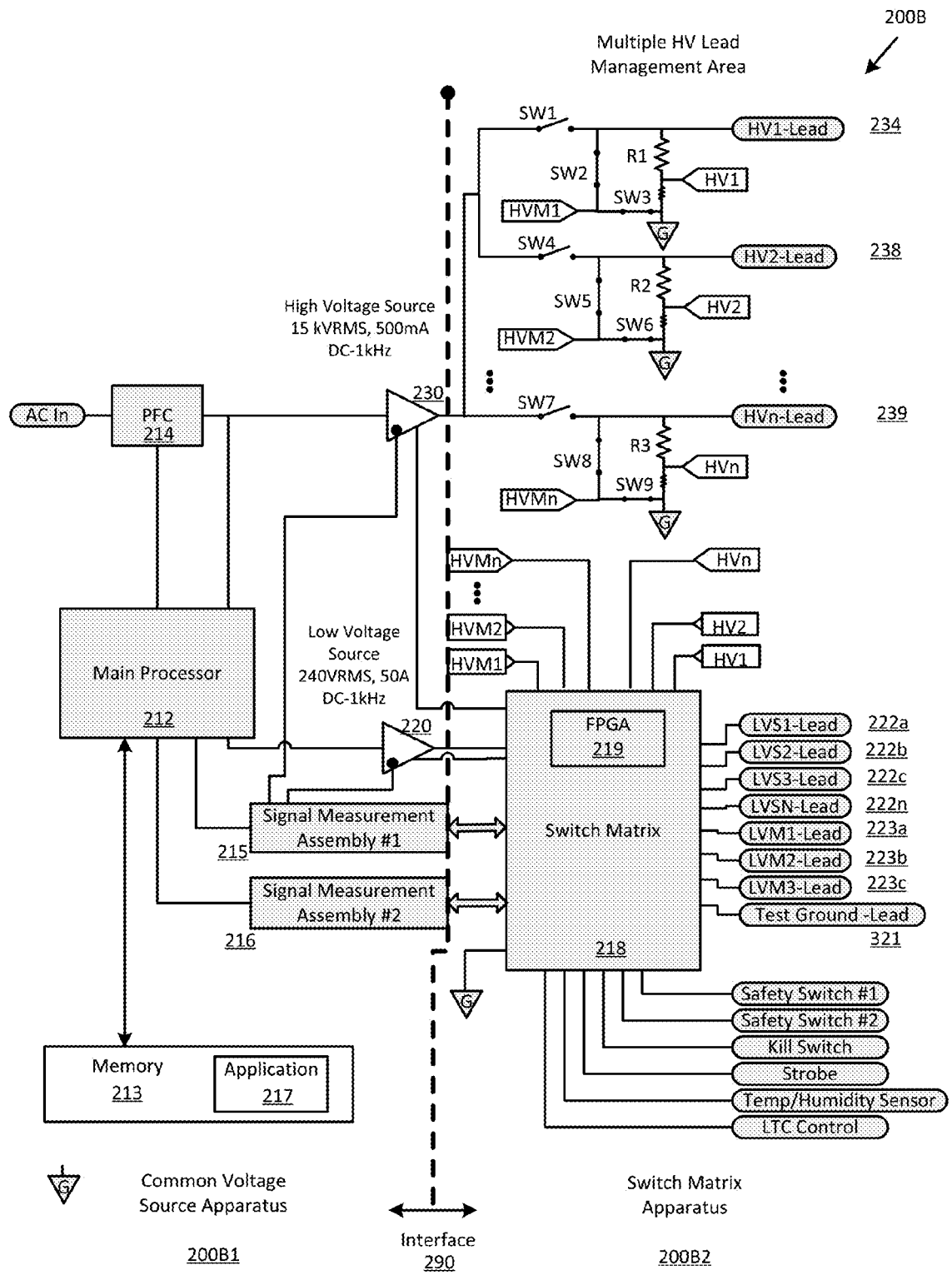
FIG. 2B illustrates an exemplary schematic block diagram of an apparatus (or alternately a system of apparatuses) used for test measurements on a utility power device using more than two high voltage leads, according to an embodiment.

FIG. 2B illustrates another embodiment of a schematic block diagram of the same apparatus (or system) as shown in FIG. 2A, using more than two high voltage leads (234, 238 and 239) for performing test measurements on a utility power device. More specifically, the apparatus (or system) (200B) includes n high voltage leads (239), where n is greater than two (e.g., 3, 4, 5, . . . n). Accordingly, the common high voltage source (230) may source n high voltage signals (HV1 to HVn) via at least n switch networks. The advantages of using more than two high voltage leads is better understood with reference to the embodiments to be illustrated at least in FIG. 3C. Likewise, FIG. 2B may also be implemented by a system (200B) formed by a common voltage source apparatus (200B1), and a separate switch matrix apparatus (200B2)

Figure 1B:
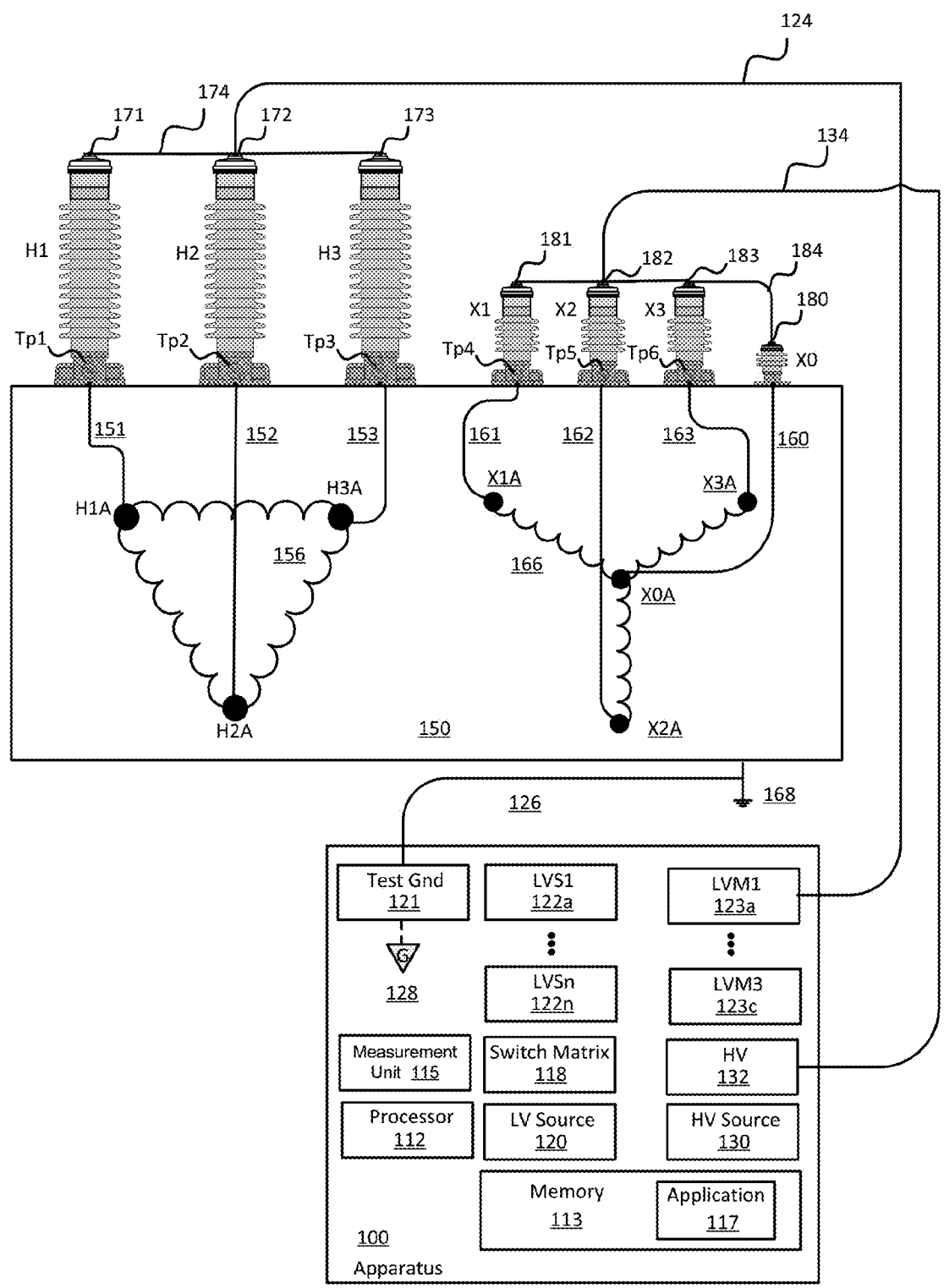
FIG. 1B illustrates the same exemplary test measurement on a utility power device in a related art method as in FIG. 1A, except carrying out by reversing the low voltage lead and the high voltage lead.
Figure 3A:
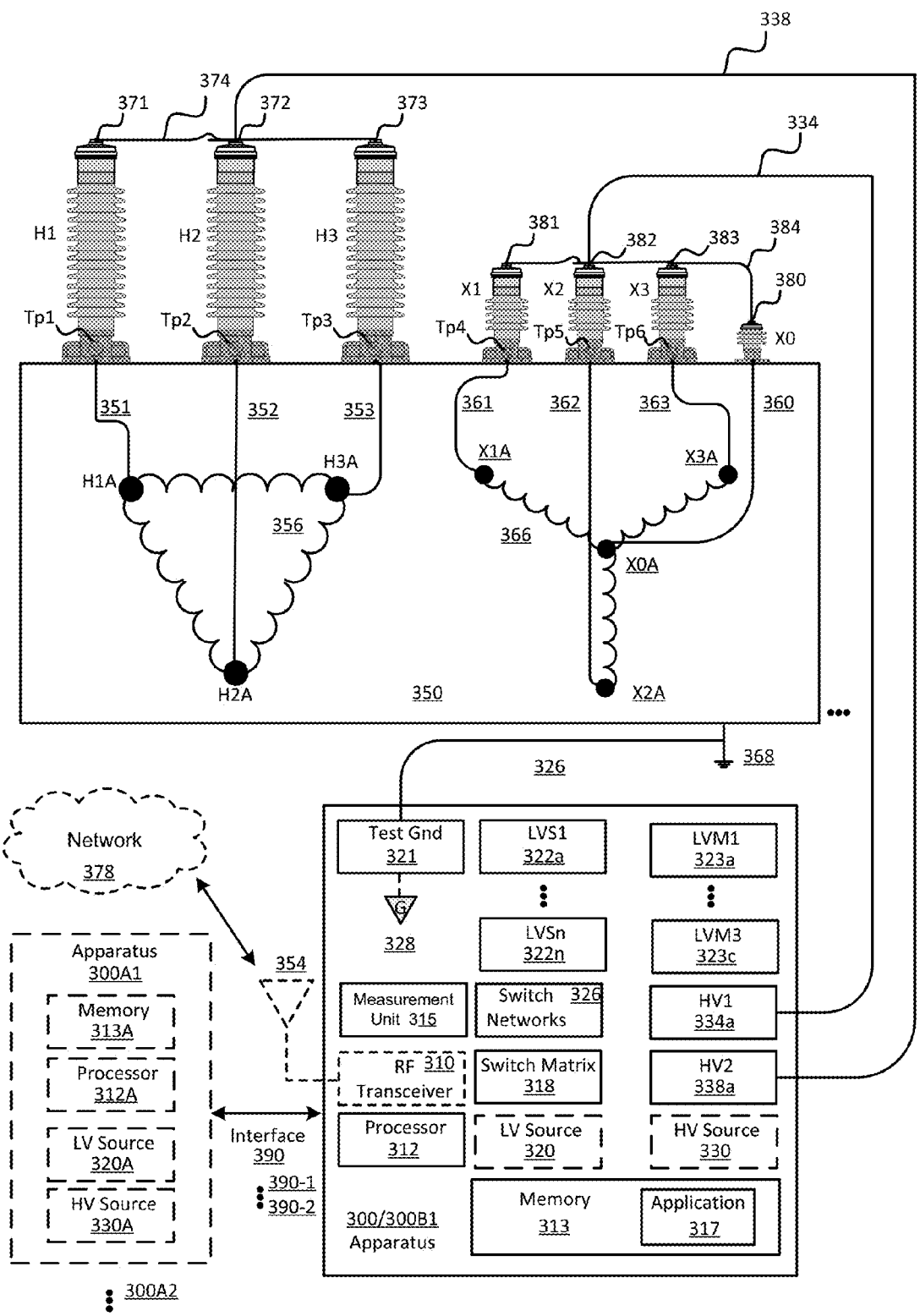
FIG. 3A illustrates an exemplary apparatus (or alternately a system of apparatuses) for carrying out test measurements on an exemplary utility power device as shown in FIGS. 1A and 1B, using two high voltage leads, according to an embodiment.

FIG. 3A depicts an exemplary apparatus (or system) embodiment (300) for performing test measurements on a utility power device (350), such as the utility power device shown in FIGS. 1A and 1B, using two high voltage leads (324, 328). The test setup configuration of FIG. 3A, in effect, replaces the test setup configuration of FIGS. 1A and 1B. Simply put, the test setup configuration of FIG. 3A performs the test measurements illustrated in both FIGS. 1A and 1B.

An exemplary power factor test to the high voltage winding side (356) according to FIG. 3A may be carried out by performing operations that include:
  (1) Placing of the high voltage lead (338) on the bus wire (374) of the high voltage windings (356) (i.e., to all three terminals on the Delta-connected transformer windings), connecting the other high voltage lead (334)) on the bus wire (384) of the low voltage windings (366) (to all three terminals on the Wye-connected transformer windings), and electrically coupling the TEST-GND port (321) of the apparatus (or system) (300) to the chassis ground (368) of the utility power device (350) via the ground lead (326).
    (a) Configuring the switch matrix (318) to connect the high voltage lead (334) to TEST-GND port (321) (i.e., by internally routing through the first and second switch networks, the high voltage port HV1 (334a) to the TEST-GND port (321)).
    (b) Configuring measurement unit (315) to measure current to the TEST-GND port (321) (i.e., measuring electrical parameters on both the current from the ground lead (326) and the high voltage lead (334)).

(c) Sending or applying a high voltage signal (HV2) from high voltage port HV2 (338a) via the high voltage lead (338) to the bus wire (374) of the high voltage windings (356), measure the applied high voltage signal (HV2), and the current in the measurement unit (315) (i.e., measuring electrical parameters on both the current from the ground lead (326) and the high voltage lead (334)).

(2) Continuing with the same leads (334, 338, 326) arrangement for the setup configuration as in FIG. 3A:

(a) Configuring switch matrix (318) to connect the high voltage lead (334) to GUARD point G (328) (i.e., by internally routing through the first and second switch networks, the high voltage port HV1 (334a) to the GUARD point (328) to by-pass the current in the high voltage lead (334)).

(b) Configuring measurement unit (315) to measure current to TEST-GND port (321).

(c) Sending or applying a high voltage signal (HV2) from high voltage port HV2 (338a) via the high voltage lead (338) to the bus wire (374) of the high voltage windings (356), measuring electrical parameters on the applied voltage (HV2), and the current in the measurement unit (315) (i.e., measuring electrical parameters on only the current from the ground lead (326).

(3) Continuing with the same leads (334, 338, 326) arrangement for the setup configuration as in FIG. 3A:

(a) Configuring switch matrix (318) to connect TEST-GND port (321) to GUARD point (328) (i.e., by internally routing through the first and second switch networks, the TEST-GND port (321) to the GUARD point (328) to by-pass the current in the ground lead (326)).

(b) Configuring measurement unit (315) to measure current to the high voltage lead (334).

(c) Measuring applied voltage (HV2), and the current in the measurement unit (315) (i.e., measuring electrical parameters on only the current from the high voltage lead (334)).

The second procedure of the power factor test on the low voltage winding side (366) may be carried out by simply applying a high voltage signal (HV1) from high voltage port HV1 (334a) via the high voltage lead (334) to the bus wire (384) of the low voltage windings (366). Accordingly, the same steps (1) to (3) may be followed above without having to change any of the high voltage leads (334, 338), which have already been connected to the utility power device (350). Measurements of electrical parameters may be taken via the high voltage lead (384), which has been connected to the bus wire (374) of the high voltage windings (356) during the initial set up.

Optionally, the test measurements or the test results may be time stamped and communicated via a wireless network (378) to an off-site server or to a remote offsite storage using an RF transceiver (310).

As seen, the power factor test measurements according to FIG. 3A to the high side windings (356) and the low side windings (366) of the utility power device (350), have altogether eliminated the need for a field worker to stop to change high voltage leads (334, 338) on the utility power device (350). Accordingly, the overall testing time is thus shortened, and the field worker would not need to regain access to the utility power device (350).

Figure 3B:
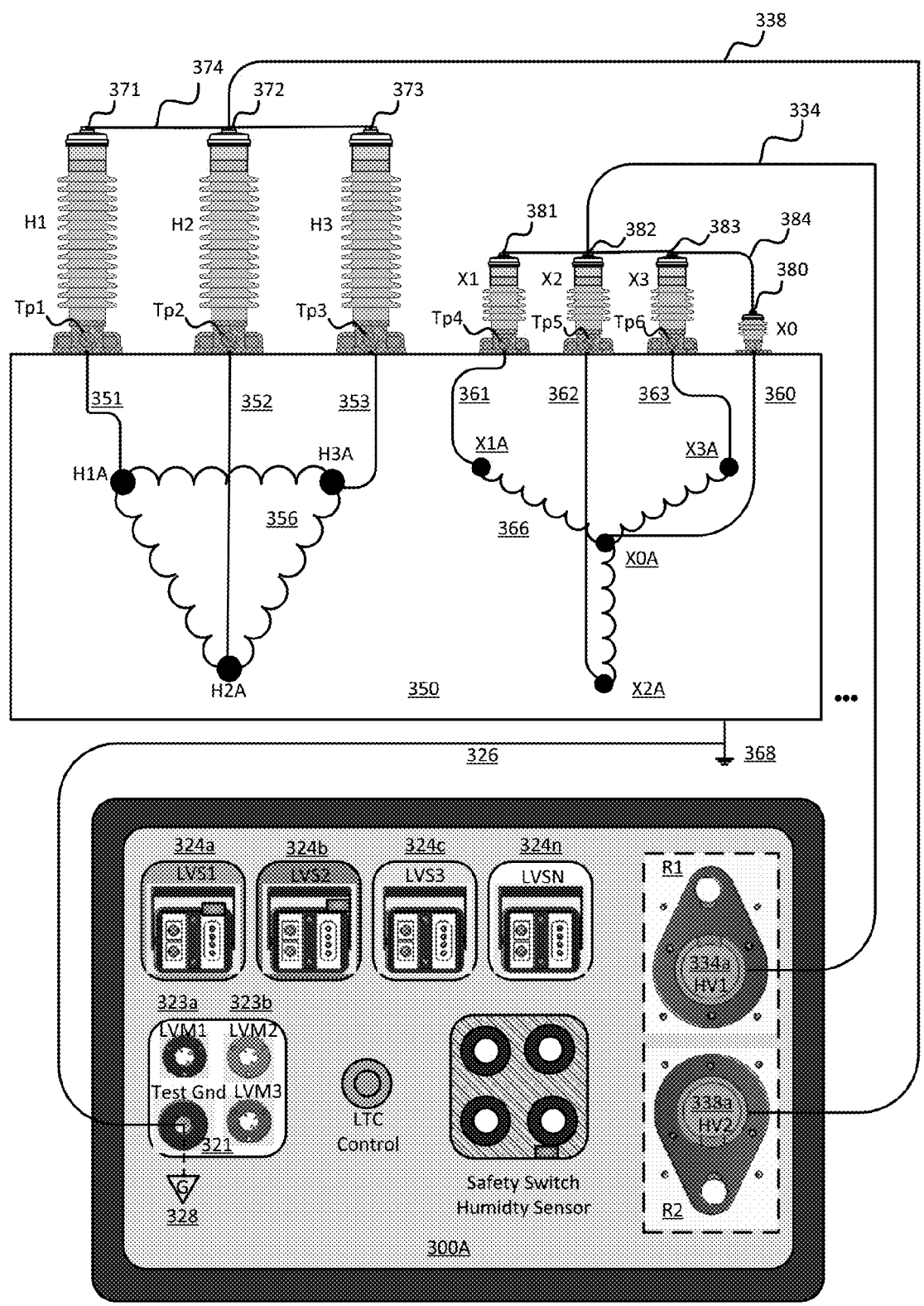
FIG. 3B illustrates a pictorial exemplary apparatus (or alternately a system of apparatuses) for carrying out identical test measurements on an exemplary utility power device as shown in FIG. 3A, using two high voltage leads, according to an embodiment.

FIG. 3B illustrates an exemplary access panel (300A) of test equipment, which performs the test measurement described above with reference to FIG. 3A using two high voltage leads (334, 338). The panel (300A) representation of the exemplary apparatus (or system) (300B) includes all the functions and elements as depicted in FIG. 3A. For the sake of consistency, the panels described below in the remaining embodiments share identical reference designations with those of the panel (300A) as in FIG. 3B.

Figure 3C:
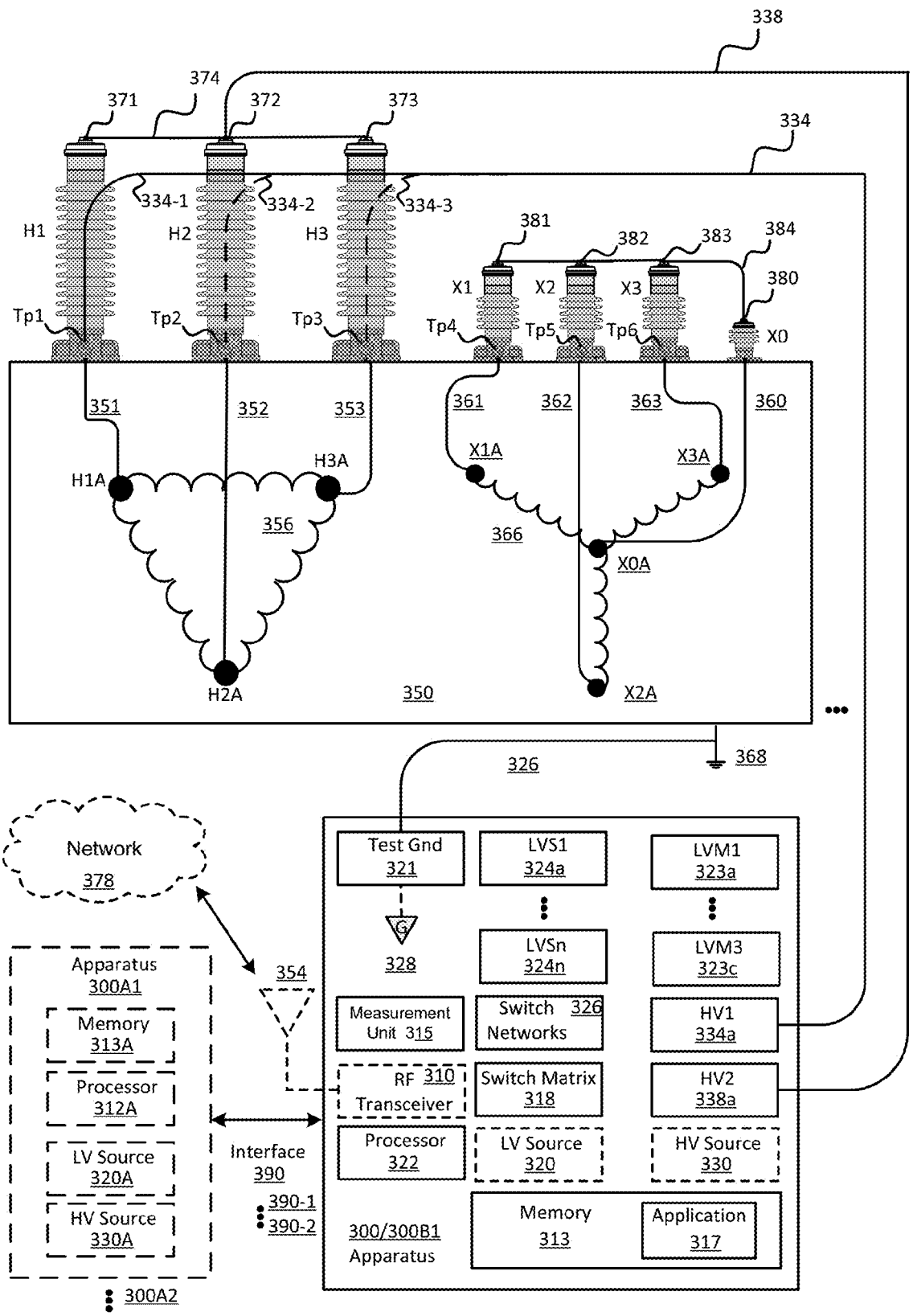
FIG. 3C illustrates another exemplary apparatus (or alternately a system of apparatuses) for carrying out test measurements on an exemplary utility power device as shown in FIGS. 1C and 1D, using two high voltage leads, according to an embodiment.

The test measurements illustrated in FIG. 3C demonstrate the benefits from using two high voltage leads (334 or 338). The same test measurements in FIG. 3C, in fact, may utilize more than two high voltage leads (not shown in the figure) to illustrate further advantages in the description to follow.

Figure 1C:
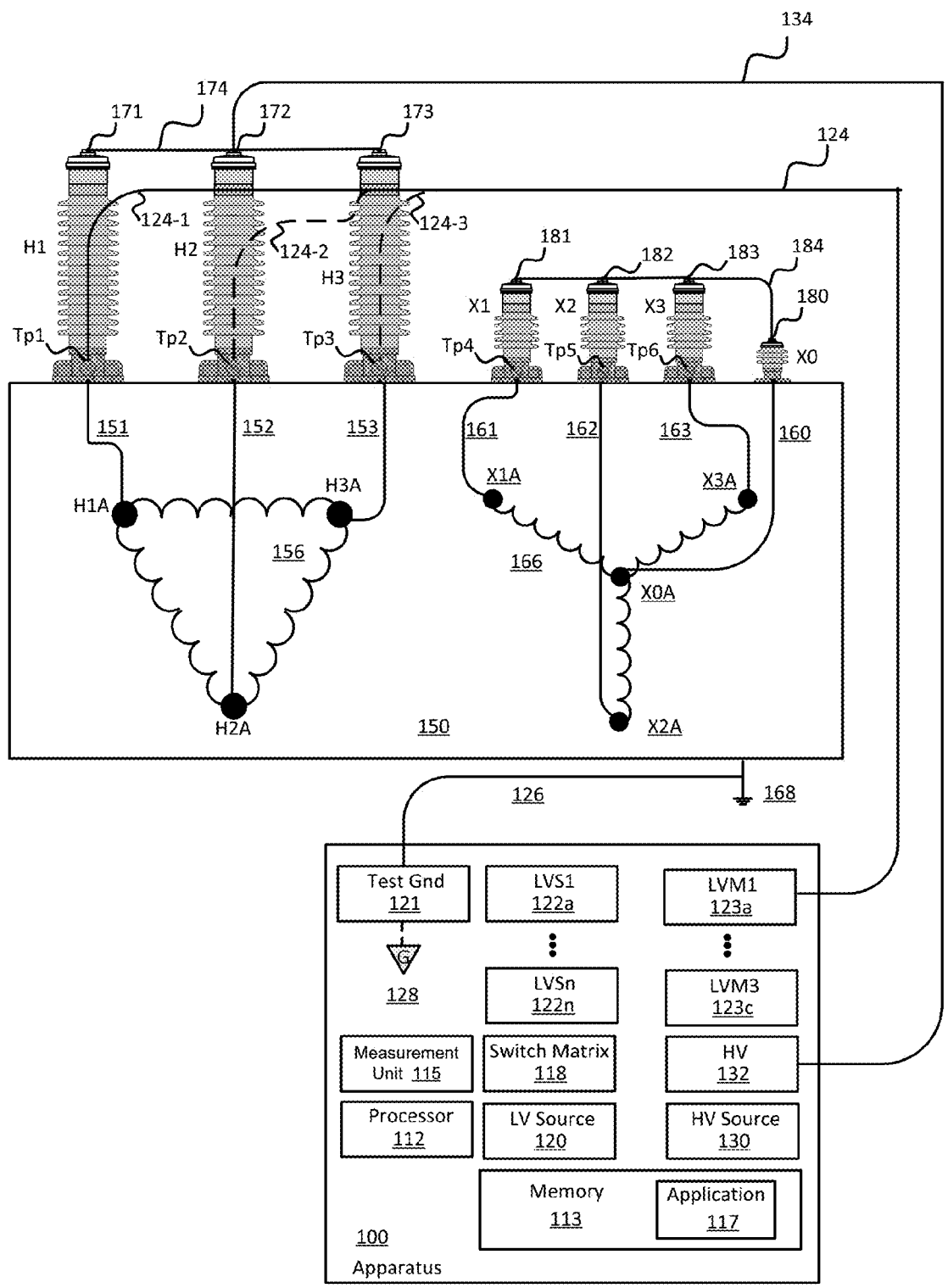
FIG. 1C illustrates another exemplary test measurement on high voltage side terminals of a utility power device in a related art method, using a low voltage lead and a high voltage lead.
Figure 1D:
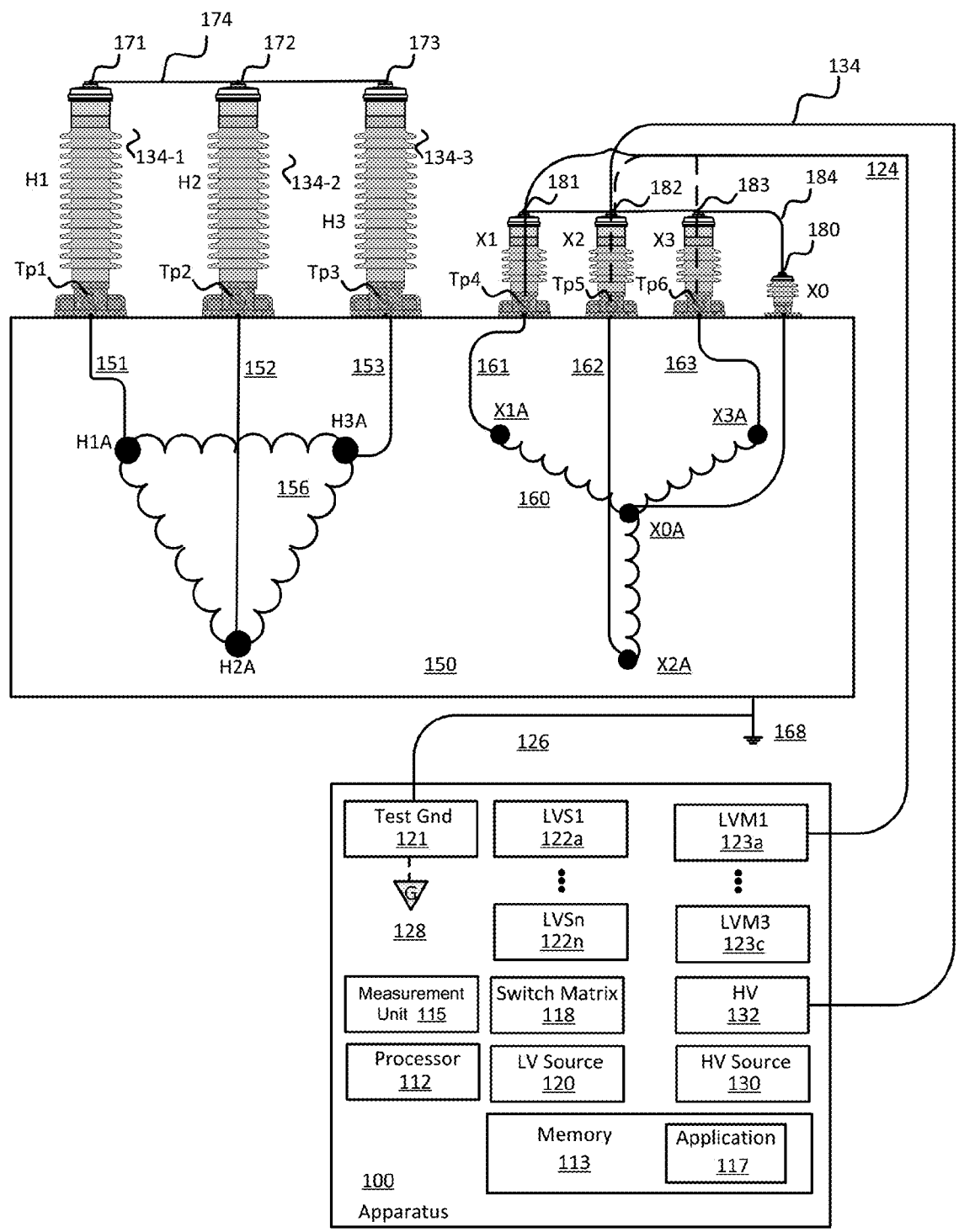
FIG. 1D illustrates another exemplary test measurement on low voltage side terminals of a utility power device in a related art method, using a low voltage lead and a high voltage lead.

The test procedure described in the setup configuration of FIG. 3C is applicable to the test routines of both FIGS. 1C and 1D by simply using a second high voltage lead (334 or 338) to connect to an electrode tap (e.g., Tp1 to Tp6) of a corresponding high voltage bushing (H1 to H3) or to a low voltage bushing (X1 to X3).

An exemplary power factor test to the high voltage bushing (H1, H2 and H3) according to FIG. 3C may be carried out as by performing operations that include:

(1) Placing of the high voltage lead (338) on the bus wire (374) of the high voltage windings (356) (i.e., to all three terminals on the Delta-connected transformer windings), connecting the other high voltage lead (334) to the tap electrode (Tp1) of the bushing (H1), and electrically coupling the TEST-GND port (321) of the apparatus (or system) (300) to the chassis ground (368) of the utility power device (350) via the ground lead (326).

(a) Configuring switch matrix (318) to connect TEST-GND port (321) to GUARD point (328) (i.e., by internally routing through the first and second switch networks, the TEST-GND port (321) to the GUARD point (328) to by-pass the current in the ground lead (326)).

(b) Configuring measurement unit (315) to measure current to the high voltage lead (334) via high voltage port (334a).

(c) Measuring applied voltage (HV2), and the current in the measurement unit (315) (i.e., measuring only the current returned from the high voltage lead (334)).

(d) Configuring switch matrix (318) to connect the high voltage lead (338) to GUARD point (328) (i.e., by internally routing through the first and second switch networks, the high voltage port (HV2) (338a) to the GUARD point (328) to by-pass the current in the high voltage lead (338)).

(e) Configure measurement unit (315) to measure current to the TEST-GND port (321).

(f) Measure applied voltage (HV1), and the current in the measurement unit (315) (i.e., measuring only the current returned from the ground lead (326)).

(2) Continuing with the same leads (338, 326) arrangement for the set up in FIG. 3C, except connecting the high voltage lead (334) to the tap electrode (Tp2), and repeating the same tests (1a-1g) for the bushing (H2).

(3) Continuing with the same leads (338, 326) arrangement for the set up in FIG. 3C, except connecting the high voltage lead (334) to the tap electrode (Tp3), and repeat the same tests (1a-1f) for the bushing (H3).

Likewise, the same power factor measurements on the low voltage bushings (X1 to X3) on the low voltage windings (166) may be implemented using a similar test setup as the configuration of FIG. 3C, except that the high voltage lead (338) is now connected to the bus wire (384) of the low voltage windings (366), and the high voltage lead (334) is now connected to the tap electrode (Tp4) of low voltage bushing X1. Accordingly, the same testing procedure of steps (1) to (3) would can carried out for the low voltage bushings (X1 to X3).

It should be noted that in carrying out steps (1) to (3) according to FIG. 3C, the field worker would need to stop only twice (i.e., in step (2) and step (3)) in order to complete the power factor testing on either the high voltage bushings (H1 to H3) or the low voltage bushings (X1 to X3). Therefore, the field worker would need to stop and regain access to the utility power device (350) altogether only four times in both tests, compared to ten times using the related art method as illustrated in FIGS. 1C and 1D. In this regard, the testing efficiency on the utility power device (350) and the risk exposure to the field worker would be improved by more than 50 percent.

In addition, the test setup configuration illustrated in FIG. 3C may be enhanced by using a four high voltage lead test setup configuration (not shown). The four high voltage lead setup may be configured as follows: a first high voltage lead may be connected to the bus wire (374), the other three high voltage leads may be connected to each of the three tap electrodes (Tp1 to Tp3), respectively. The switch matrix (318) may be programmed to control the internal switching of the corresponding high voltage relays and the corresponding low voltage switches within the plurality of network switches, and the routing of the proper ports to the Guard point (328). Accordingly, the return signals may be measured via the respective three of the high voltage ports, and the Test Ground port (321).

In using the four high voltage lead setup configuration, the entire power factor test routine for all three high voltage bushings (H1 to H3) may be carried out uninterrupted without any voltage lead changes at all. Likewise, the power factor tests for all three low voltage bushings (X1 to X3) may be carried out without interruption using the same four high voltage lead test setup configuration, except that one of the four high voltage leads would be connected to the low voltage side bus wire (384), and the remaining three high voltage leads would be connected to the three electrode taps (Tp4-Tp6), respectively. Consequently, the described embodiment of using the four high voltage leads may substantially shorten the testing time, while completely eliminating any need to regain access to the utility power device (350) in carrying out steps (1) to (3).

The description of the above exemplary steps and operations in FIGS. 3A and 3B may equally be implemented using a system of multiple apparatuses, such as at least a common voltage source apparatus (300A1) coupled to a switch matrix apparatus (300B1) through an interface (390). In the system embodiment, the common voltage source apparatus (300A1) may include at least a common high voltage source 330A, a common low voltage source 320A, a processor 312A and a memory 313A and a RF transceiver with processing interface (not shown). The switch matrix apparatus (300B1) may have its own processor (312) (i.e., FPGA), and the common high voltage source (330), the common low voltage source (320) would only be optional features not necessarily be required.

Alternately, the system of multiple apparatuses may include a plurality of respective common voltage source apparatuses (300A1, 300A2 . . . ), each separately and respectively coupled to a same single switch matrix apparatus (300B1) see FIGS. 3A, 3C) through the respective interfaces (390-1, 390-2 . . . ), such that each of the plurality of common voltage source apparatuses (300A1, 300A2 . . . ) may each simultaneously communicate with and control the single switch matrix apparatus (300B1) in order to perform multiple test measurements on the utility power device (350) or on a separate respective utility power device (not shown due to space constraint on the drawings) directly, through respective cables output from respective ports of the same single switch matrix apparatus (300B1).

Alternately, the single switch matrix apparatus (300B1) in the system may enable simultaneously performing multiple test measurements on two or more respective utility power devices (not shown) through controlling the same switch matrix apparatus (300B1) through the respective interfaces (390) which are directly coupled to the two or more respective separate common voltage source apparatuses (300A1, 300A2 . . . ), by simply simultaneously executing the same steps or operations (as described in FIG. 3A or 4) using voltage outputs from the two or more respective separate common voltage source apparatuses (300A1, 300A2 . . . ) through the respective interface (390-1, 390-2 . . . ) on the same single switch matrix apparatus (300B1) in the system.

It should be pointed out that the switching matrix networks and output ports on the single switching matrix apparatus 300B1 may be scalable to accommodate higher number of terminals to be connected on a same utility power device under test, or to accommodate higher number of separate utility power device simultaneously under tests.

Figure 3D:
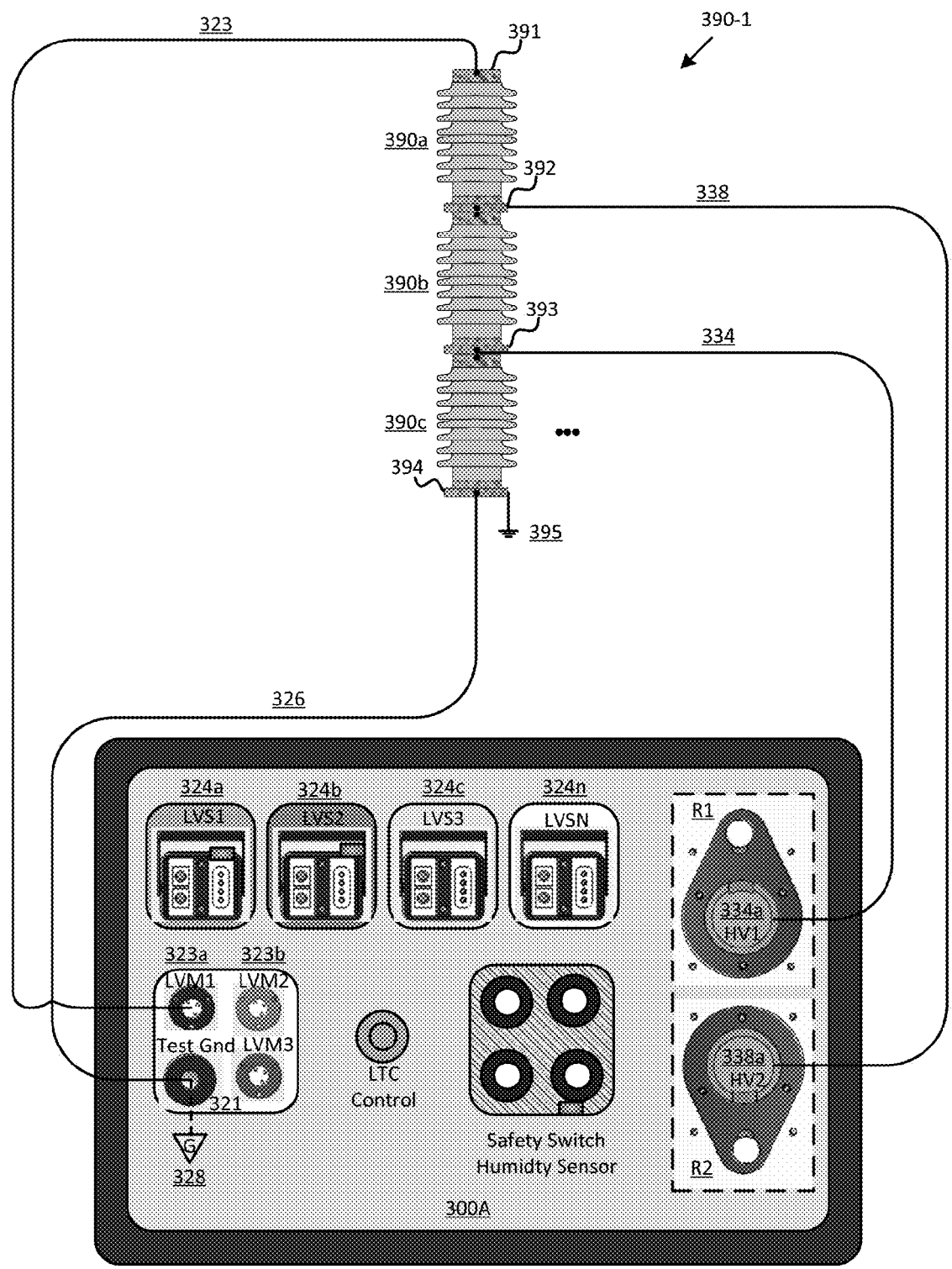
FIG. 3D illustrates a pictorial exemplary apparatus (or alternately a system of apparatuses) for carrying out test measurements on an exemplary utility power device (e.g., a triple stack surge arrestors) using two high voltage leads and a low voltage leads, according to an embodiment.

FIG. 3D illustrates an exemplary test panel (300A) for carrying out another exemplary test measurements on a utility power device, such as a triple stack surge arrestors (390-1), using two high voltage leads (334, 338) and additional low voltage leads (323, 326), according to an embodiment of the invention.

Utility power devices such as surge arrestors are important protective devices used on electric systems to ensure operation continuity despite repeated voltage surges resulting from lightning or from switching (e.g., substation grid current re-route). Surge arrestors may be stacked in series for high voltage protection. Testing of stacked surge arrestors requires testing the individual surge arrestors. Therefore, using the related art method would require multiple lead changes to complete the tests. More information about the surge arrestors their testing using related art methods may be found in chapter six of the "Doble Test Procedures", which is incorporated by reference.

FIG. 3D depicts a triple stack arrest (390-1), which is formed by stacking three individual arrestors (390a, 390b, 390c). The testing of the individual arrestors (390a, 390b, 390c) on the triple stack arrestor (390-1) may be carried out by performing operations that include:
1) Placing high voltage leads (334, 338), low voltage lead (323) and ground lead (326) as shown in FIG. 3D.
2) Testing the bottom surge arrester (390c):
   a. Configuring switch matrix (318) to connect low voltage port LVM1 (323a) and high voltage port HV2 (338a) to GUARD point (328).
   b. Configuring measurement unit (315) to measure current to TEST-GND port (321).
   c. Connecting HV1 port (334a) to high voltage common source (330).
   d. Applying high voltage signals to HV1 port (334a).
   e. Measuring applied high voltage (HV1), and current in the measurement unit (315).
3) Testing middle arrester (390b)
   a. Configuring switch matrix (318) to connect low voltage port LVM1 (323a) and TEST-GND port. (321) to GUARD point (328).
   b. Configuring measurement unit (315) to measure HV1 port (334a).

c. Connecting HV2 port (338*a*) to high voltage common source (330).
d. Applying high voltage signals to HV2 port (338*a*).
e. Measuring applied high voltage HV2, and current in the measurement unit (315).

4) Testing top arrester (390*a*)
   a. Configuring switch matrix (318) to connect low voltage port LVM1 (323*a*) to TEST-GND port (321).
   b. Configuring switch matrix (318) to connect HV1 port (334*a*) to GUARD point (328).
   c. Configuring measurement unit (315) to measure TEST-GND port (321).
   d. Connecting HV2 port (338*a*) to high voltage common source (330).
   e. Applying high voltage signals to HV2 port (338*a*).
   f. Measuring applied high voltage, and current in the measurement unit (315).

It should be noted that the testing of the triple stacked surge arrestors (390-1) using the two high voltage lead (334, 338) setup method may be carried out uninterrupted without having to stop any of the above steps (1) to (4), or changing any high voltage leads (334, 338). Compared with using a single high voltage lead in the related art method, the test would require the field worker to stop and move the single high voltage lead at least once to complete the remaining surge arrestor test.

Figure 3E:
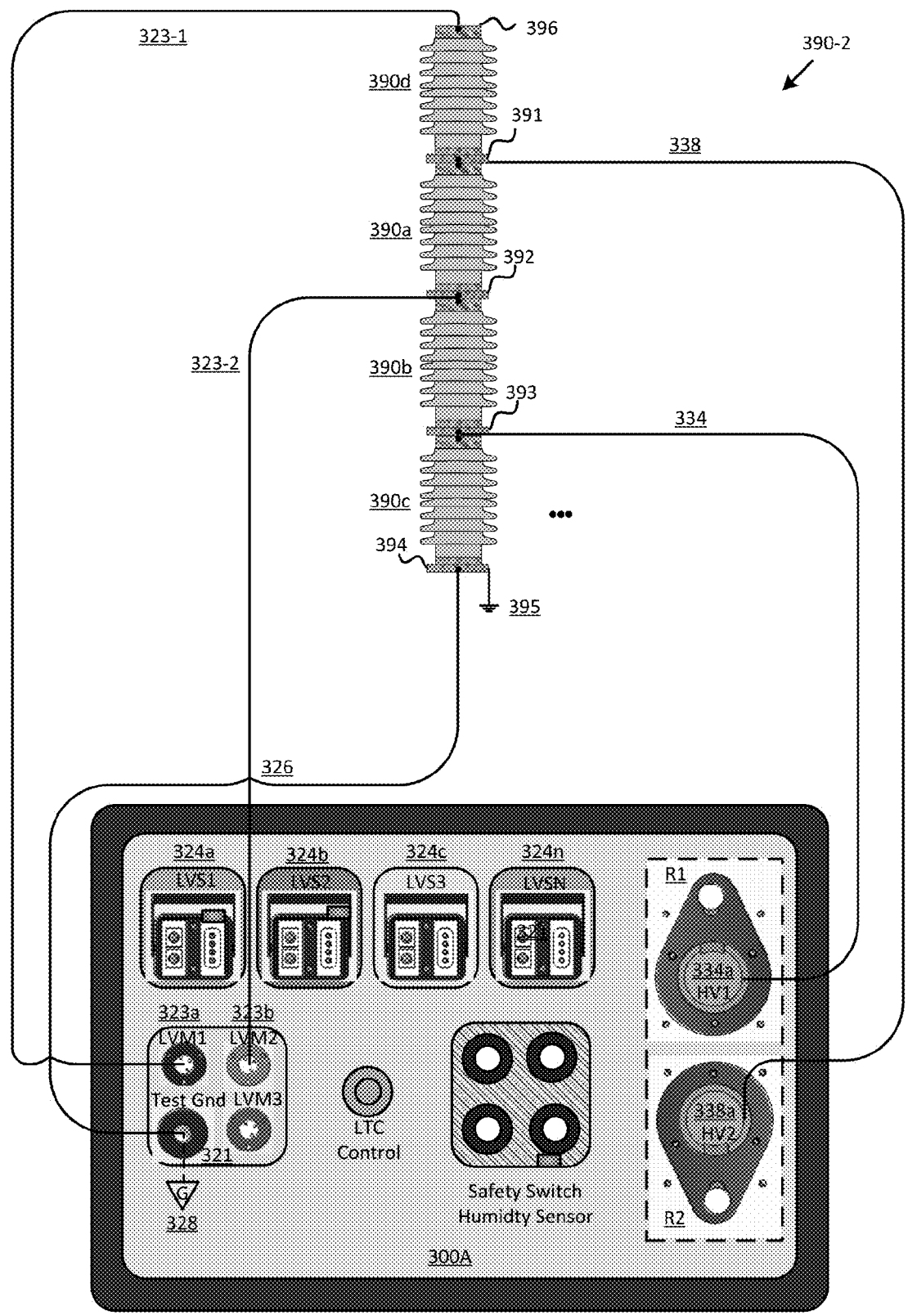
FIG. 3E illustrates a pictorial exemplary apparatus (or alternately a system of apparatuses) for carrying out test measurements on an exemplary utility power device (e.g., quadruple stack surge arrestors) using two high voltage leads and two low voltage leads, according to an embodiment.

Likewise, the same test panel (300A) may be used to carry out test measurements on a quadruple stack surge arrestors (390-2), using two high voltage leads (334, 338) and two low voltage leads (323-1, 323-2), as shown in FIG. 3E according to another embodiment of the application.

As seen, by simply rearranging the connections between the two high voltage leads (334, 338) to connect to the connecting terminals (393, 391), and the two low voltage leads (323-1, 323-2) to connect to the surge arrestor connecting terminals (392, 396), respectively, all four surge arrestors (390*a* to 390*d*) may be tested in a modified test sequence without lead changes or interruptions.

Figure 3F:
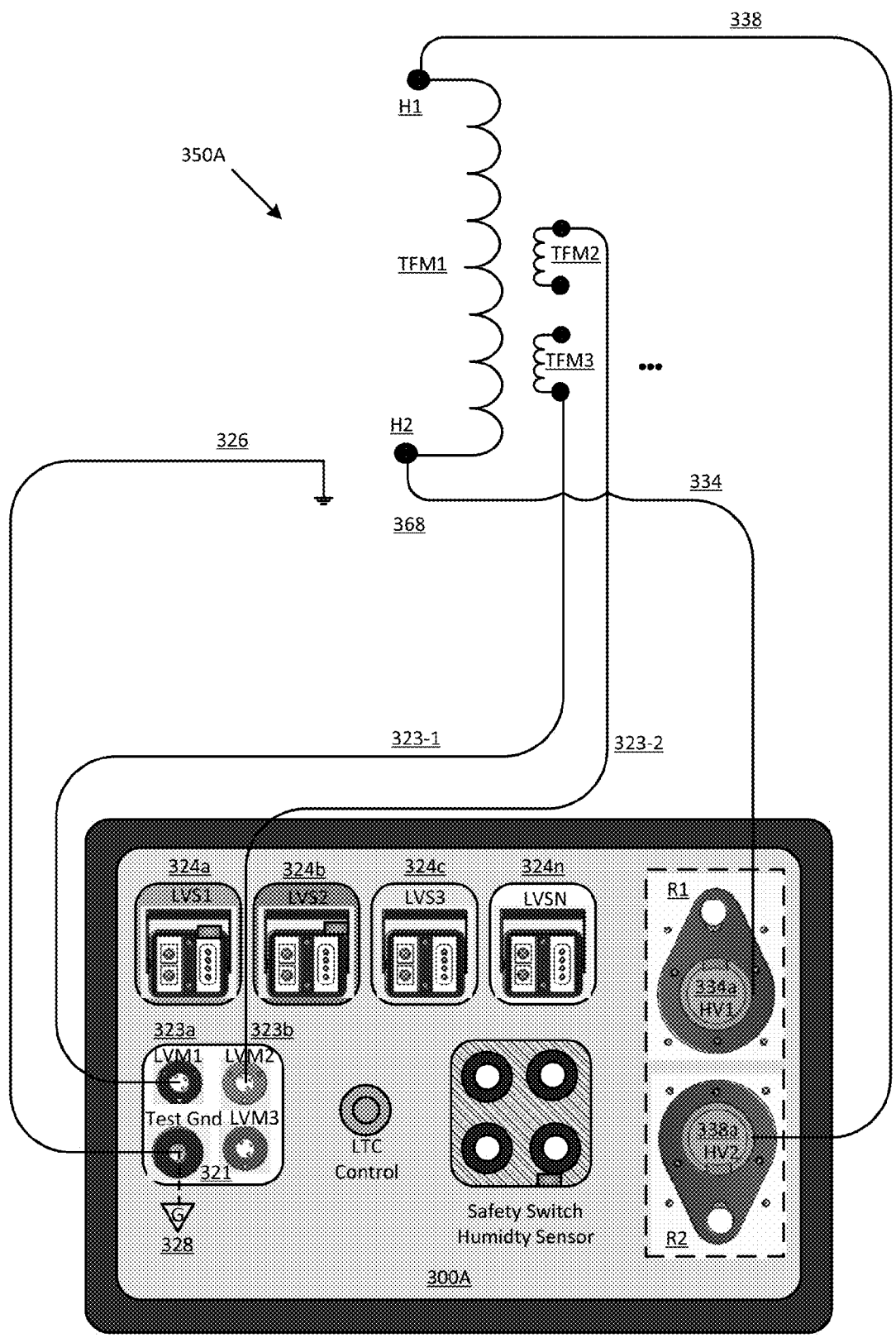
FIG. 3F illustrates a pictorial exemplary apparatus (or alternately a system of apparatuses) for carrying out test measurement on a utility power device, where high voltages signals may be simultaneously applied to both high voltage leads, or to one of the high voltage leads sequentially, and using two low voltage leads and a ground lead for return signals measurements, according to an embodiment.

FIG. 3F illustrates an exemplary embodiment test measurement method, where two high voltage signals (HV1, HV2) may be applied simultaneously in carrying out test measurements on a utility power device (350A), in addition to applying the two high voltage signals (HV1, HV2) in sequence.

The utility power device may be a potential transformer (PT) (350A), which may be used on high voltage power systems for voltage indication and in applications involving metering and power relaying equipment. The potential transformer (350A) may include a primary winding TFM1 with terminals H1 and H2, and a plurality of secondary windings (TFM2, TFM3).

The entire testing routine of the potential transformer (PT) (350A) may be carried out without stopping or changing any voltage leads. The PT test measurements may be carried out by performing operations that include:

1) Placing of the high voltage leads (324, 328), low voltage leads (323-1, 323-2) and ground lead (326) as shown in FIG. 3F.
2) Overall Testing by:
   a. Configuring switch matrix (318) to internally connect low voltage ports LVM1 (323*a*), and LVM2 (323*b*) to TEST-GND port (323).
   b. Configuring measurement unit (315) to measure current to TEST-GND port (323) (i.e., sum of currents from TFM2, TFM3 via low voltage leads (323-1, 323-2) and chassis ground current via ground lead (326)).
   c. Connecting high voltage ports HV1 (334*a*) and HV2 (334*b*) to high voltage common source (330). In a system embodiment, the high voltage signals may instead be supplied through a high voltage common source (330A) in an external common high voltage source apparatus (300A1) which is coupled through an interface (390) to a switch matrix apparatus (300B1) (i.e., the switch matrix apparatus (300B1) void of the HV source 330 and the LV source 320).
   d. Simultaneously applying high voltage signals (HV1, HV2) via high voltage ports HV1 (334*a*) and HV2 (334*b*) to high voltage leads (334, 338).
   e. Measuring applied voltages HV1, HV2, and current in the measurement unit (315).

3) H1 terminal Cross Checking by:
   a. Configuring switch matrix (318) to internally connect low voltage ports LVM1 (323*a*), and LVM2 (323*b*) to TEST-GND port (323).
   b. Configuring switch matrix (318) to internally connect high voltage port HV2 (338*a*) to GUARD point (328).
   c. Configuring measurement unit (315) to measure current to TEST-GND port (321) (i.e., sum of currents from TFM2, TFM3 via low voltage leads (323-1, 323-2) and chassis ground current via ground lead (326))
   d. Connecting high voltage port HV1 (334*a*) to high voltage common source (330).
   e. Applying high voltage signals (HV1) to high voltage port HV1 (334*a*).
   f. Measuring applied voltage signals (HV1), and current in the measurement unit (315).

4) H2 terminal Cross Checking by:
   a. Configuring switch matrix (318) to internally connect low voltage ports LVM1 (323*a*), and LVM2 (323*b*) to TEST-GND port (323).
   b. Configuring switch matrix (318) to connect high voltage port HV1 (334*a*) to GUARD point (328).
   c. Configuring measurement unit (315) to measure current to TEST-GND port (323).
   d. Connecting high voltage port HV2 (338*a*) to high voltage common source (330).
   e. Applying high voltage signals (HV2) to high voltage port HV2 (338*a*).
   f. Measuring applied voltage signals (HV2), and current in the measurement unit (315).

5) Facilitating H1-H2 terminal excitation current by:
   a. Configuring switch matrix (318) to internally connect low voltage ports LVM1 (323*a*), and LVM2 (323*b*) to GUARD point (328).
   b. Configuring measurement unit (315) to connect GUARD point (328) to TEST-GND port (323).
   c. Configuring measurement unit (315) to measure current to H2 terminal
   d. Connecting high voltage port HV1 (334*a*) to high voltage common source (330).
   e. Applying high voltage signals (HV1) to high voltage port HV1 (334*a*).
   f. Measuring applied voltage signals (HV1), and current in the measurement unit (315).

6). Facilitating H2-H1 terminal excitation current by:
   a. Configuring switch matrix (318) to internally connect low voltage ports LVM1 (323*a*), and LVM2 (323*b*) to GUARD point (328).
   b. Configuring measurement unit (315) to connect GUARD point (328) to TEST-GND port (323).

c. Configuring measurement unit (315) to measure current to H1 terminal.
d. Connecting high voltage port HV2 (338*a*) to high voltage common source (330).
e. Applying high voltage signals (HV2) to high voltage port HV2 (338*a*).
f. Measuring applied voltage signals (HV2), and current in the measurement unit (315).

If the same PT test is carried out using a single high voltage lead and at least two low voltage leads in the related art method (see "Doble Test Procedures", pp. 5-19 to 5-27), the high voltage lead would have been placed on one of the terminal side (H1 or H2) to apply a high voltage, while the low voltage lead would be placed on the other terminal (H2 of H1) to make measurements. Accordingly, the high voltage lead and the low voltage lead would need to be swapped at least three times in carrying out tests (3) to (6). It should be further noted that the "Overall Test" (2) (which requires simultaneously applying of high voltages HV1 and HV2 to both terminals H1, H2) would not have been possible, using the single high voltage lead in the related art method.

FIGS. 2A-2B and 3A to 3F may be referred back to further illustrate the various embodiments of performing multiple test measurements on a utility power device (see 350 in FIGS. 3A-3C, 390-1, 390-2 and 350A in FIGS. 3D to 3F) by a system (of multiple apparatuses). The system may include a switch matrix apparatus (see 200A2, 200B2 in FIGS. 2A, 2B, and 300B1 in FIGS. 3A and 3C) which may be disposed between the utility power device (e.g., 390-2 in FIG. 3E) and the common voltage source apparatus (see 200A1, 200B1 in FIGS. 2A, 2B and 300A1 in FIGS. 3A, 3C), wherein the switch matrix apparatus and the common voltage source apparatus are each separate devices, which are directly coupled to each other through an interface (290 in FIGS. 2A, 2B and 390 in FIGS. 3A, 3C)), such that the common voltage source apparatus (see 200A1, 200B1 in FIGS. 2A, 2B and 300A1 in FIGS. 3A, 3C) may communicate with and control the switch matrix apparatus (see 200A2, 200B2 in FIGS. 2A, 2B, and 300B1 in FIGS. 3A and 3C) in order to perform multiple test measurements without leads disconnection on the utility power device (350 in FIGS. 3A-3C, 390-1, 390-2 and 350A in FIGS. 3D to 3F) through the switch matrix apparatus (see 200A2, 200B2 in FIGS. 2A, 2B, and 300B1 in FIGS. 3A and 3C).

The switch matrix apparatus (see 200A2, 200B2 in FIGS. 2A, 2B) may include: a first switching network (SW1, SW2, SW3 in FIG. 2A) having at least one input port and a plurality of corresponding output ports (see HV1, HV2, LVM1, LVM2 in FIG. 2A) coupled to respective test leads (234, 238 in FIG. 2A), and a switching matrix (218 in FIG. 2A) which communicates measured voltage signals to the common voltage source apparatus and controls the first switching network via own local processor (FPGA 219 in FIG. 2A) in response to control signals received from the common voltage source apparatus (see 200A1, 200B1 in FIGS. 2A, 2B).

The common voltage source apparatus (200A1) may include: at least a processor (212 in FIG. 2A) executing programmable codes (217 in FIG. 2A) stored in a local memory (213 in FIG. 2A) configuring the common voltage source apparatus to control an internal local high voltage source (230 in FIG. 2A, 330 in FIG. 3A), an internal local low voltage source (220 in FIG. 2A, 320 in FIG. 3A), and the switching matrix (218 in FIG. 2A) of the externally coupled switch matrix apparatus (see 200A2, 200B2 in FIGS. 2A, 2B, and 300B1 in FIGS. 3A and 3C).

To keep remaining description concise, relevant elements in certain exemplary figures may be referred to (instead of referring to all relevant figures) for illustrations. In an embodiment of a system of multiple apparatuses, the system may include configuring the common voltage source apparatus (see 200A1, 200B1 in FIGS. 2A, 2B) to control the switch matrix apparatus (see 200A2, 200B2 in FIGS. 2A, 2B), wherein the first output port (HV1) and the second output port (HV2) of the switch matrix apparatus are connected to a first test lead (234 in FIG. 2A or 334 in FIG. 3E) and a second test lead (238 in FIG. 2A or 338 in FIG. 3E) in order to send and receive signals.

The multiple test measurement method by the system may further include programmable controlling of the switch matrix (218) within the switch matrix apparatus (200A2 in FIG. 2A) to perform: selectively coupling both the first test lead (234 in FIG. 2A or 334 in FIG. 3E) and the second test lead (238 in FIG. 2A or 338 in FIG. 3E) of the switch matrix apparatus (200A2) to an internal common high voltage source (230) local to the common voltage source apparatus (200A1); sending and receiving high voltage signals to a first terminal (393 in FIG. 3E) and a second terminal (391 in FIG. 3E) of the utility power device (390-2 in FIG. 3E), wherein the common voltage source apparatus (200A1), the switch matrix apparatus (200A2) and the utility power device (e.g., 390-2 in FIG. 3E) all share a common ground (see G in FIG. 2A, 3E); coupling a first low voltage lead (323-2 in FIG. 3E) of the switch matrix apparatus (200A2) to a third terminal (392 in FIG. 3E) of the utility power device (390-2 in FIG. 3E), wherein the third terminal (392 in FIG. 3E) is neither a chassis ground nor the common ground of the utility power device (390-2).

The multiple test measurement method by the system may further include: selectively sending by the common voltage source apparatus (200A1), a first high voltage signal via the first lead (334 in FIG. 3E or 234 in FIG. 2A) of the switch matrix apparatus (300A in FIG. 3E or 200A2 in FIG. 2A) to the first terminal (393 in FIG. 3E) of the utility power device (390-2 in FIG. 3E); measuring by the common voltage source apparatus (200A1 in FIG. 2A), respective first electrical parameters across the first terminal (393 in FIG. 3E) and the second terminal (391 in FIG. 3E) of the utility power device (390-2 in FIG. 3E) as a first corresponding signal returned via the second lead (338 in FIG. 3E or 238 in FIG. 2A) of the switch matrix apparatus (300A or 200A2) which is connected to the second terminal (391 in FIG. 3E) of the utility power device (390-2); simultaneously measuring by the common voltage source apparatus (200A1 or 300A1), respective third electrical parameters across the first terminal (393 in FIG. 3E) and the third terminal (392 in FIG. 3E) of the utility power device (390-2 in FIG. 3E) returned via the first low voltage lead (323-2 in FIG. 3E or 223*b* in FIG. 2A) of the switch matrix apparatus (300A or 200A2) which is connected to the third terminal (392 in FIG. 3E) of the utility power device (390-2 in FIG. 3E); while the corresponding first lead (334 in FIG. 3E or 234 in FIG. 2A), the second lead (338 in FIG. 3E or 238 in FIG. 2A) and the first low voltage lead (323-2 in FIG. 3E or 223*b* in FIG. 2A) of the switch matrix apparatus remain electrically coupled to the corresponding first terminal (393), the second terminal (391) and the third terminal (392) of the utility power device (390-2), selectively sending by the common voltage source apparatus (200A1 in FIG. 2A or 300A1 in FIG. 3A), a second high voltage signal via the second lead (338 in FIG. 3E or 238 in FIG. 2A) of the switch matrix apparatus to the second terminal (391) of the utility power device (390-2), measuring by the common voltage source apparatus (200A1 in FIG.

2A or 300A1 in FIG. 3A), respective second electrical parameters across the second terminal (391) and the first terminal (393) of the utility power device as a second corresponding signal returned via the first lead (334 in FIG. 3E or 234 in FIG. 2A) of the switch matrix apparatus which is connected to the first terminal (393) of the utility power device; and simultaneously measuring by the common voltage source apparatus, respective fourth electrical parameters across the second terminal (391) and the third terminal (392) of the utility power device returned via the first low voltage lead (323-2 in FIG. 3E or 223b in FIG. 2A) of the switch matrix apparatus which is connected to the third terminal (392) of the utility power device (390-2).

In an embodiment of a system, the switch matrix apparatus (see 200A2, 200B2 in FIGS. 2A, 2B, 300B1 in FIGS. 3A, 3C) is coupled to a common voltage source apparatus (see 200A1, 200B1 in FIGS. 2A, 2B, 300A1, 300A2 in FIGS. 3A, 3C) for performing multiple test measurements on a utility power device (see 350 in FIGS. 3A-3C, 390-1, 390-2 and 338 in FIGS. 3D to 3F). The switch matrix apparatus (see 200A2, 200B2 in FIGS. 2A, 2B, 300B1 in FIGS. 3A, 3C) may be disposed between the utility power device (see 350 in FIGS. 3A-3C, 390-1, 390-2 and 338 in FIGS. 3D to 3F) and a common voltage source apparatus (see 200A1, 200B1 in FIGS. 2A, 2B, 300A1, 300A2 in FIGS. 3A, 3C), wherein the switch matrix apparatus and the common voltage source apparatus are each separate external devices, such that the common voltage source apparatus (200A1 in FIG. 2A, 300A1 in FIG. 3A) communicates with and controls the switch matrix apparatus (200A2 in FIG. 2A, 300B1 in FIG. 3A) through an interface (290 in FIG. 2A, 390 in FIG. 3A) in order to perform the multiple test measurements on the utility power device (350 in FIG. 3A) directly through the switch matrix apparatus (200A2 in FIG. 2A, 300B1 in FIG. 3A).

The switch matrix apparatus (see 200A2, 200B2 in FIGS. 2A, 2B) may include: at least a first switch network (SW1, SW2, SW3 in FIG. 2A) having at least one input port and a plurality of corresponding output ports (see HV1, HV2, LVM1, LVM2 in FIG. 2A) coupled to at least respective test leads (e.g., 234, 238 in FIG. 2A) which are coupled to respective terminals (391-394 in FIG. 3E) on the utility power device (390-2 in FIG. 3E); a switch matrix (218 in FIG. 2A) which is configurable by a processor (FPGA 219 in FIG. 2A) which executes program codes (application 217) stored in a memory (213), wherein the switch matrix (218 in FIG. 2A) is configured to: communicate measured voltage signals to the common voltage source apparatus (see 200A1, 200B1 in FIGS. 2A, 2B) and control the first switch network (SW1, SW2, SW3 in FIG. 2A) in response to control signals received from the common voltage source apparatus (200A1 in FIG. 2A) which comprises an internal local high voltage source (230 in FIG. 2A) and an internal local low voltage source (220 in FIG. 2A); couple a first low voltage lead (323-2 in FIG. 3E or 223b in FIG. 2A) of the switch matrix apparatus (200A2 in FIG. 2A) to a third terminal (392 in FIG. 3E) of the utility power device (390-2 in FIG. 3E), wherein the third terminal (392 in FIG. 3E) is neither a chassis ground (395 in FIG. 3E) nor a common ground G (328 in FIG. 3E) of the utility power device (350 in FIG. 3A, or 390-2 in FIG. 3E); couple at least both a first lead (334 in FIG. 3E or 234 in FIG. 2A) and a second lead (338 in FIG. 3E or 238 in FIG. 2A) of the switch matrix apparatus (see 200A2, 200B2 in FIGS. 2A, 2B) to the internal common high voltage source (230 in FIG. 2A) of the common source voltage apparatus (200A1 in FIG. 2A) which sends and receives high voltage signals to a first terminal (393 in FIG. 3E) and a second terminal (391 in FIG. 3E) of the utility power device (390-2 in FIG. 3E), wherein the common voltage source apparatus (see 200A1, 200B1 in FIGS. 2A, 2B), the switch matrix apparatus (see 200A2, 200B2 in FIGS. 2A, 2B) and the utility power device (390-2 in FIG. 3E) all share the common ground G (328 in FIG. 3E); wherein via the first lead (334 in FIG. 3E or 234 in FIG. 2A) of the switch matrix apparatus (200A2 in FIG. 2A), a first high voltage signal of the common voltage source apparatus (200A1 in FIG. 2A) is selectively sent to the first terminal (393 in FIG. 3E) of the utility power device (390-2), and respective first electrical parameters across the first terminal (393 in FIG. 3E) and the second terminal (391 in FIG. 3E) of the utility power device as a first corresponding return signal to be measured by the common voltage source apparatus (200A1 in FIG. 2A), is received via the second lead (338 in FIG. 3E or 238 in FIG. 2A) of the switch matrix apparatus (200A2 in FIG. 2A) which is connected to the second terminal (391 in FIG. 3E) of the utility power device; simultaneously pass to the common voltage source apparatus, respective third electrical parameters across the first terminal (393 in FIG. 3E) and the third terminal (392 in FIG. 3E) of the utility power device returned via the first low voltage lead (323-2 in FIG. 3E or 223b in FIG. 2A) of the switch matrix apparatus, to be measured by the common voltage source apparatus; while the corresponding first lead (334 in FIG. 3E or 234 in FIG. 2A), the second lead (338 in FIG. 3E or 238 in FIG. 2A) and the first low voltage lead (323-2 in FIG. 3E or 223b in FIG. 2A) of the switch matrix apparatus remain electrically coupled to the corresponding first terminal (393), the second terminal (391) and the third terminal (392) of the utility power device (390-2), the switch matrix apparatus is configured to selectively send to the common voltage apparatus, a second high voltage signal via the second lead (338) of the switch matrix apparatus to the second terminal (391) of the utility power device, such that respective second electrical parameters across the second terminal (391) and the first terminal (393) of the utility power device as a second corresponding return signal received via the first lead (334) of the switch matrix apparatus to be measured by the common voltage apparatus; and simultaneously pass to the common voltage source apparatus, respective fourth electrical parameters across the second terminal (391) and the third terminal (392) of the utility power device via the first low voltage lead (323-2 in FIG. 3E or 223b in FIG. 2A) of the switch matrix apparatus (200A2 in FIG. 2A) to the common voltage apparatus (200A1) for measurement.

As seen, the above utility power device testing method utilizing the system (of multiple apparatuses) achieves the benefits of a reduction in frequency of having to connect and disconnect, or reconnecting both the high voltage leads (334, 338 in FIGS. 3E, 234 and 238 in FIG. 2A) and low voltage leads (323-2 in FIG. 3E or 223b in FIG. 2A) to the various terminals (391-396 in FIG. 3E) of the utility power device (390-2 in FIG. 3E), thereby improving personnel safety in a hazardous work environment and a reduction in total test time.

In addition, the system embodiment provides another benefit of carrying out the multiple test and measurement method in modular apparatuses, which a switch matrix apparatus (200A2) may be a portable stand-alone apparatus coupled to or interfaced with one or a plurality of stand-alone common voltage apparatuses (200A1), which the plurality of stand-alone common voltage apparatuses (200A1) may each be a portable voltage source equipment or heavy equipment mounted on a truck or on a cart) parked or stationed at a distance to the test site of the utility power devices. The test technician or worker therefore does not need to carry the bulky and heavy voltage supply apparatus to the test site, rather only the switch matrix apparatus (which is less bulky and lighter) to the utility power device, thus allowing flexibility to test configurations, higher productivity and less worker fatigue which may result in workers injury on the job.

Moreover, the stand-alone switch matrix apparatus (see 200A2, 200B2 in FIGS. 2A, 2B) may be scaled up to include even more switch networks, and a higher number of test ports, and the control logic in the stand-alone switch matrix apparatus (see 200A2, 200B2 in FIGS. 2A, 2B) may be reprogrammed (through the FPGA 219 in FIG. 2A) to allow more test leads or cables of the stand-alone switch matrix apparatus, to be connected to more terminals on the same utility power device, or may simultaneous testing on two or more utility power device through the same common voltage apparatus, or through interfacing with multiple respective common voltage apparatuses. The modularity applications of the stand-alone switch matrix apparatus are not limited by the description of the exemplary embodiments or limited by the exemplary illustrations of the figures.

Figure 4:
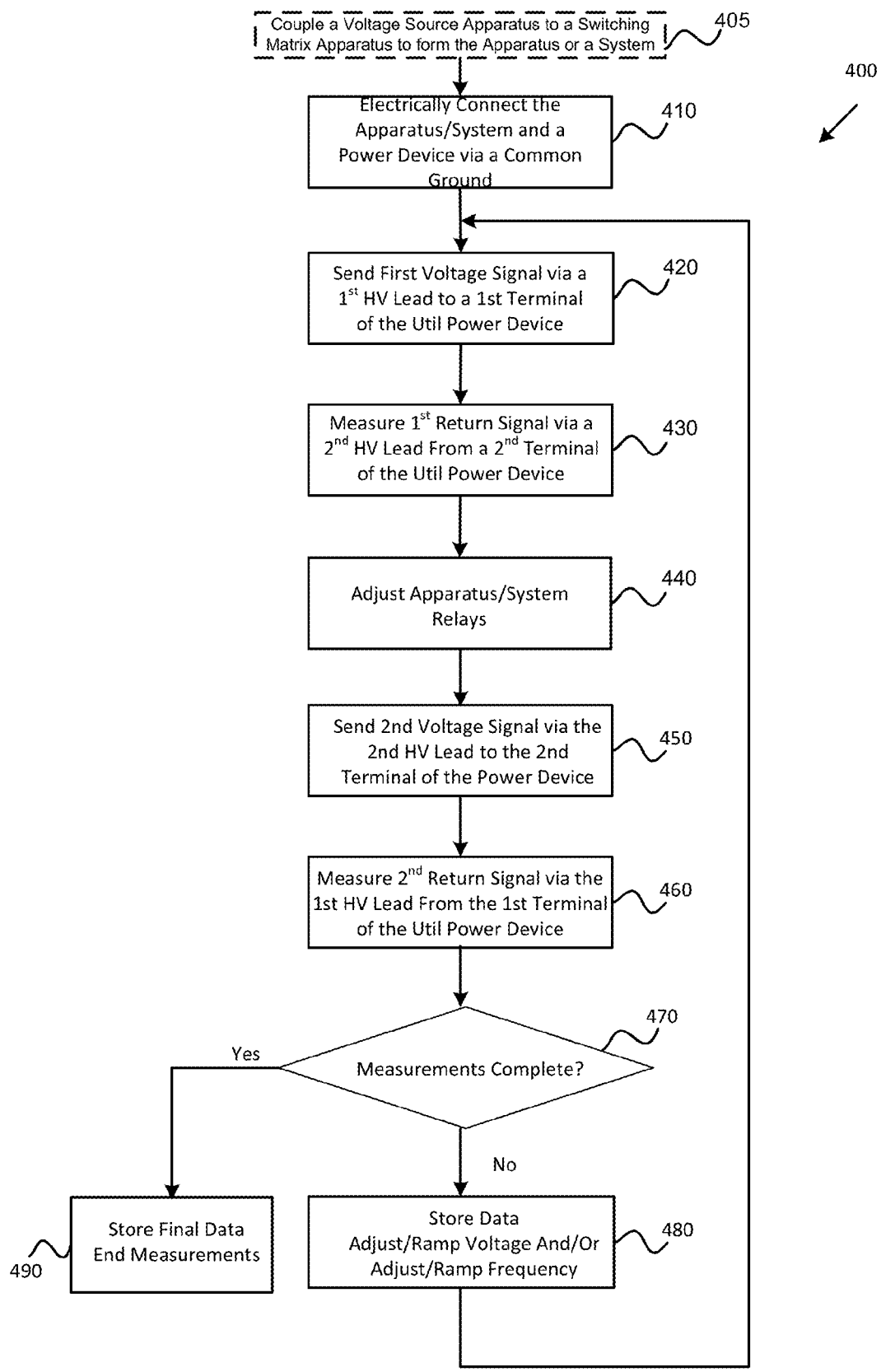
FIG. 4 is a flow chart which illustrates an apparatus (or alternately a system of apparatuses) performing exemplary steps for test measurements on an exemplary utility power device using two high voltage leads, according to an embodiment.

FIG. 4 is a flow chart, which illustrates exemplary operations or steps performed by an apparatus (or system) (200A, 200B, 300 or 300A) in FIGS. 2A-2B, 3A-3F, in testing a utility power device using at least two high voltage leads.

Step (405) is an optional step applicable only to an embodiment using a system of multiple apparatuses. The system embodiment (see 200A and 200B in FIGS. 2A, 2B, and 300 in FIGS. 3A and 3C) may include at least a switch matrix apparatus (see 200A2, 200B2 in FIGS. 2A, 2B, and 300A2 in FIG. 3A) and a common voltage source apparatus (see 200A1, 200B1 in FIGS. 2A, 2B and 300A1 in FIG. 3A). Disposing a switch matrix apparatus (see 200A2, 200B2 in FIGS. 2A, 2B, and 300 in FIGS. 3A and 3C) between the utility power device (350 in FIG. 3A) and the common voltage source apparatus (see 200A1, 200B1 in FIGS. 2A, 2B), wherein the switch matrix apparatus and the common voltage source apparatus are separate external devices directly coupled to each other through an interface (290 in FIGS. 2A, 2B), such that the common voltage source apparatus (see 200A1, 200B1 in FIGS. 2A, 2B) communicates with and controls the switch matrix apparatus (see 200A2, 200B2 in FIGS. 2A, 2B) in order to perform multiple test measurements on the utility power device (350 in FIG. 3A) directly through the switch matrix apparatus (see 200A2, 200B2 in FIGS. 2A, 2B).

In step (410), prior to the start of any test measurements, the apparatus (or system) (300) and the utility power device (350) are both electrically grounded to a common ground (328) (i.e., an earth ground by default).

In step (420), after connecting the respective high voltage leads (324, 328), and ground lead (326) to the device chassis (368), and any necessary low voltage leads (e.g., 323) to the utility power device (350) according to the test set up configuration (FIGS. 3A to 3F), a common high voltage source (330) may send a first voltage signal (e.g., HV2) via a first high voltage lead (338) to a first terminal (e.g., 374 high voltage side) of the utility power device.

In step (430), the measurement unit (315) of the apparatus (or system) (300) may measure a first return signal via a second high voltage lead (334) of the apparatus (or system) from a second terminal (e.g., 384 low voltage side) of the utility power device (350).

In step (440), the apparatus (or system) (300) may internally configure a corresponding switch network to open or close one or more high voltage relays (SW1, SW2, SW4, SW5) or one or more low voltage switch (SW3, SW6) to connect a corresponding high voltage port (HV1) to the common source voltage (330).

In step (450), the common high voltage source (330) may send a second voltage signal (HV1) via the second high voltage lead (324) to the second terminal (e.g., 384 low voltage side) of the utility power device.

In step (460), the measurement unit (315) of the apparatus (or system) may measure a second return signal via the first high voltage lead (338) of the apparatus (or system) from the first terminal of the utility power device (e.g., 374 high voltage side).

In step (470), a determination may be made as to whether the measurements in a test routine have been completed.

In step (480), assuming that the measurements in a test routine are ongoing, the apparatus (or system) may store the last measured data, the common high voltage source may perform one or both of: adjust or ramp to a next output voltage (>500V, e.g., 1 kV to 15 kV), adjust or ramp to a next test frequency (DC to 1 kHz) of the output voltage, and loop back to step (420) to repeat the test routine again.

In step (490), assuming that the measurements in a test routine have completed, the apparatus (or system) (300) may store the last measured data, reset the apparatus (or system) to preset state and end the test measurement.

It should be pointed out that the disclosure described in FIGS. 2A-2B and 3A to 3F above, may be performed on a wide range of multi windings transformers and many other utility power devices, such as circuit breakers, power and distribution transformers, current transformers, voltage regulators, meters, Askare-Filled transformers, switches, relays, reclosers, sectionalizers, cables, terminations, grading capacitors, coupling capacitors, switch banks, to name a few.

In addition, the various operations may be performed in DC or in AC mode. If in AC mode, the tests may be performed in single phase or in multiphase. The electrical parameters to be measured may include voltage, current, impedance, conductance, phase angle, transformer turns ratios, leakage currents, dielectric loss, power factor, tan delta, load burden, arcing, partial discharge, to name a few. The sequence of testing and test lead arrangements may be rearranged to accomplish the objectives of the test procedure according to what a person of ordinary skill in the art may see fit, after reviewing the disclosure of the various embodiments.

The disclosed embodiments of methods and apparatus (or system) may be used to perform many of the tests procedure on the utility power devices disclosed by both the "Doble Test Procedures" (Doble Engineering Company's Publication Number 500-0397, document 72A-2244 Rev A) and the IEEE Standard Test Code for Liquid-immersed Distribution, Power and Regulating Transformers (IEEE Std C57.12.90-2010), which are incorporated by reference in its entirety as part of the disclosure.

All or part of the operations described above in the embodiments may be implemented via instruction code/program operable to cause relevant hardware to perform the operations, and the program may be stored in a non-transitory computer readable storage medium, such as a ROM/RAM, a magnetic disk, or an optical disk, which are executed in a machine, such as in a computer, a laptop, a server, or cloud computing infrastructure.

It will be apparent to those skilled in the art that various modifications and variations can be made to the present disclosure without departing from the scope or spirit of the disclosure. In view of the foregoing, it is intended that the present disclosure cover modifications and variations of this disclosure provided they fall within the scope of the following claims and their equivalents.

What is claimed:

1. A method for performing multiple test measurements on a utility power device, the method comprising:
providing a switch matrix apparatus that comprises:
one or more common voltage source apparatus (CVA) ports configured to be coupled to corresponding ports of a common voltage source apparatus;
first and second utility side device (USD) ports configured to be coupled to first and second terminals of utility power device;
a first low voltage lead configured to be coupled to a third terminal of the utility power device through a corresponding first lead and a second lead;
switch matrix circuitry configured to selectively electrically couple the one or more CVA ports, the first and second USD ports, and the first low voltage lead to one another;
a ground node configured to be coupled to a common ground node shared by the common voltage source apparatus and the utility power device; and
a processor for controlling the switch matrix circuitry that includes a communication interface for communicating information to the processor;
controlling, by the processor and responsive to instructions received via the communication interface, the switch circuitry to selectively couple the first and second USD ports to one of the one or more CVA ports, wherein the one CVA port being configured to be coupled to an internal common high voltage source local to the common voltage source apparatus;
wherein the selectively coupling of the first and second USD ports to the one of the one or more CVA ports facilitates the test measurements on the utility power device, comprising: selectively communicating a first high voltage signal from a common voltage source apparatus to the first terminal of the utility power device; measuring by the common voltage source apparatus, respective first electrical parameters across the first terminal and the second terminal of the utility power device as a first corresponding signal returned via the second lead of the switch matrix apparatus which is connected to the second terminal of the utility power device; and simultaneously measuring by the common voltage source apparatus, respective third electrical parameters across the first terminal and the third terminal of the utility power device returned via the first low voltage lead of the switch matrix apparatus which is connected to the third terminal of the utility power device.

2. The method according to claim 1, wherein while the corresponding first lead, the second lead and the first low voltage lead of the switch matrix apparatus remain electrically coupled to the corresponding first terminal, the second terminal and the third terminal of the utility power device, selectively sending by the common voltage source apparatus, a second high voltage signal via the second lead of the switch matrix apparatus to the second terminal of the utility power device,
measuring by the common voltage source apparatus, respective second electrical parameters across the second terminal and the first terminal of the utility power device as a second corresponding signal returned via the first lead of the switch matrix apparatus which is connected to the first terminal of the utility power device; and
simultaneously measuring by the common voltage source apparatus, respective fourth electrical parameters across the second terminal and the third terminal of the utility power device returned via the first low voltage lead of the switch matrix apparatus which is connected to the third terminal of the utility power device.

3. The method according to claim 2, wherein the switch matrix apparatus comprises:
a first switch network having at least one input port and a plurality of corresponding output ports coupled to respective test leads, and
the switch matrix circuitry communicates measured voltage signals to the common voltage source apparatus and controls the first switch network via the processor in response to control signals received from the common voltage source apparatus;
wherein the common voltage source apparatus comprises:
at least a local processor executing programmable codes stored in a local memory configuring the common voltage source apparatus to control an internal local high voltage source, an internal local low voltage source, and the switch matrix circuitry of the externally coupled switch matrix apparatus.

4. The method according to claim 3, wherein the selectively sending of the first high voltage signal and the second high voltage signal and the measuring of the respective electrical parameters corresponding to the first and the second return signals, comprising:
internally switching by the switch matrix apparatus, a corresponding first and second switch network, each having a plurality of high voltage relays and at least one switch, wherein the internal switching comprising:
connecting the first lead and the second lead to a first port on the switch matrix apparatus corresponding the first switch network and a second port on the switch matrix apparatus corresponding the second switch network of the switch matrix apparatus, respectively;
controlling by the common voltage apparatus, the first switch network and the second switch network via a corresponding first switching logic and a second switching logic, respectively; and
electrically coupling the corresponding first switch network and the second switch network to the internal common high voltage source via a corresponding first plurality of high voltage relays and a second plurality of high voltage relays, respectively, wherein the corresponding first plurality of high voltage relays and the second plurality of high voltage relays are each controlled by a corresponding first relay logic and a second relay logic of the common voltage apparatus, respectively, in order to selectively output one of: the first high voltage via the first lead, the second high voltage via the second lead, or simultaneously sending the first and the second high voltage via the first and the second lead of the switch matrix apparatus.

5. The method according to claim 4, comprising utilizing a corresponding precision impedance in the corresponding first and second switch network of the switch matrix apparatus, respectively, for sampling the corresponding first and the second high voltage signals, and the corresponding first and second return signals.

6. The method according to claim 2, comprising:
coupling a second low voltage lead of the switch matrix apparatus to a fourth terminal of the utility power device;
outputting by an internal low voltage source of the common voltage apparatus, a common low voltage signal to the third terminal of the utility power device via the first low voltage lead of the switch matrix apparatus, wherein the internal low voltage source and the internal common high voltage source utilize a third switch network of the switch matrix apparatus which is separate and different from the first switch network for sending the first and second high voltage signals and for receiving the respective first and second corresponding signals returned via the first lead and the second lead of the switch matrix apparatus; and
simultaneously measuring respective fifth electrical parameters across the third terminal and the fourth terminal of the utility power device returned via the second low voltage lead of the switch matrix apparatus which is connected to the fourth terminal of the utility power device.

7. The method according to claim 3, comprising utilizing one or more additional switch network and one or more additional leads from the switch matrix apparatus for sending one or more additional high voltage signals to one or more additional terminals of the utility power device, or for receiving a corresponding one or more additional return signals from the utility power device in measuring a corresponding one or more additional electrical parameters.

8. The method according to claim 1, comprising electrically coupling another low voltage lead from the switch matrix apparatus to a chassis ground of the utility power device.

9. The method according to claim 1, wherein the internal common high voltage source of the common voltage source apparatus performs at least one of: ramping the high voltage signal over a frequency range covering 0 Hz (DC) to at least 1 KHz (AC), and ramping the high voltage signal over a voltage range covering 1 kV to at least 15 kV.

10. The method according to claim 1, wherein the utility power device at least being one of: a power transformer, a current transformer, a switched capacitor bank, a circuit breaker, a recloser, a relay, a transformer bushing, a coupling capacitor and a surge arrester.

11. The method according to claim 1, wherein the electrical parameters comprise one or more of: current, voltage, phase, impedance, capacitance, transformer turns ratio (TTR), reactance leakage, dielectric loss, power factor, tan delta, load burden, partial discharge or arcing.

12. The method according to claim 1, comprising selectively routing the corresponding first or the second return signals via one or more guard points internal to the switch matrix apparatus, wherein the one or more guard points are designated as signal return nodes internal to the switch matrix apparatus.

13. The method according to claim 1, comprising:
coupling both the first lead and the second lead of the switch matrix apparatus to the internal common high voltage source, and simultaneously sending a high voltage signal via the first lead and the second lead of the switch matrix apparatus to a first and a second terminal of the utility power device; and
measuring by the common voltage source apparatus, the corresponding first and the second return signals via at least one or both of the first and a second low voltage leads of the switch matrix apparatus which are coupled between at least one or both of the third and a fourth terminals of the utility power device.

14. The method according to claim 1, wherein the multiple test measurements on the utility power device comprising coupling the one or more CVA ports of the switch matrix apparatus to corresponding ports of two or more respective separate common voltage source apparatuses through respective communication interfaces, such that each of the two or more common voltage source apparatuses each simultaneously and independently communicates with and controls the switch matrix apparatus in order to perform multiple test measurements on the utility power device directly through the switch matrix apparatus.

15. The method according to claim 14, wherein the switch matrix apparatus simultaneously performs multiple test measurements on two or more respective utility power devices through controlling the switch matrix apparatus through the respective communication interfaces which are directly coupled to the two or more respective separate common voltage source apparatuses.

16. A switch matrix apparatus that comprises:
one or more common voltage source apparatus (CVA) ports configured to be coupled to corresponding ports of a common voltage source apparatus;
first and second utility side device (USD) ports configured to be coupled to first and second terminals of utility power device;
a first low voltage lead configured to be coupled to a third terminal of the utility power device through a corresponding first lead and a second lead;
switch matrix circuitry configured to selectively electrically couple the one or more CVA ports, the first and second USD ports, and the first low voltage lead to one another;
a ground node configured to be coupled to a common ground node shared by the common voltage source apparatus and the utility power device;
a processor for controlling the switch matrix circuitry that includes a communication interface for communicating information to the processor; and
non-transitory computer readable media that stores instruction code that when executed by the processor, causes the processor to:
control the switch matrix circuitry to selectively couple the first and second USD ports to the one of the one or more CVA ports in response to instructions received via the communication interface, the one CVA port being configured to be coupled to an internal common high voltage source local to the common voltage source apparatus;
wherein the selectively coupling of the first and second USD ports to the one of the one or more CVA ports facilitates test measurements on the utility power device by: selectively communicating a first high voltage signal from a common voltage source apparatus to the first terminal of the utility power device; measuring by the common voltage source apparatus, respective first electrical parameters across the first terminal and the second terminal of the utility power device as a first corresponding signal returned via the second lead of the switch matrix apparatus which is connected to the second terminal of the utility power device; and simultaneously measuring by the common voltage source apparatus, respective third electrical parameters across the first terminal and the third terminal of the utility power device returned via the first low voltage lead of the switch matrix apparatus which is connected to the third terminal of the utility power device.

17. The switch matrix apparatus according to claim 16, wherein:
while the corresponding first lead, the second lead and the first low voltage lead of the switch matrix apparatus remain electrically coupled to the corresponding first terminal, the second terminal and the third terminal of the utility power device, the switch matrix apparatus is configured to selectively send by the common voltage apparatus, a second high voltage signal via the second lead of the switch matrix apparatus to the second terminal of the utility power device, such that respective second electrical parameters across the second terminal and the first terminal of the utility power device as a second corresponding return signal is received via the first lead of the switch matrix apparatus to be measured by the common voltage apparatus; and
simultaneously passes to the common voltage source apparatus, respective fourth electrical parameters across the second terminal and the third terminal of the utility power device via the first low voltage lead of the switch matrix apparatus which is connected to the third terminal of the utility power device to the common voltage apparatus for measurement.

18. The switch matrix apparatus according to claim 17, comprises:
at least a first switch network having at least one input port and a plurality of corresponding output ports coupled to at least respective test leads which are coupled to respective terminals on the utility power device;
a switch matrix circuitry configurable by the processor which executes program codes stored in a memory, wherein the switch matrix is configured to:
communicate measured voltage signals to the common voltage source apparatus and control the first switch network in response to control signals received from the common voltage source apparatus, wherein the common voltage source apparatus comprises:
at least a local processor executing programmable codes stored in a local memory configuring the common voltage source apparatus to control an internal local high voltage source, an internal local low voltage source, and the switch matrix circuitry of the externally coupled switch matrix apparatus.

19. The switch matrix apparatus according to claim 18, comprises:
a corresponding first and second switch network, each having a plurality of high voltage relays and at least one switch which facilitates the selecting of the first high voltage signal and the second high voltage signal and the measuring of the respective electrical parameters corresponding to the first and the second return signals; wherein:
the first lead and the second lead of the switch matrix apparatus are selectively connected to the corresponding first switch network and the second switch network of the switch matrix apparatus, respectively;
the first switch network and the second switch network are controlled by a corresponding first switching logic and a second switching logic, respectively;
the corresponding first switch network and the second switch network are electrically coupled to the common high voltage source of the common voltage apparatus via a corresponding first plurality of high voltage relays and a second plurality of high voltage relays of the switch matrix apparatus, respectively; and wherein the corresponding first and the second plurality of high voltage relays are each controlled by a corresponding first and a second relay logic of the switch matrix apparatus, respectively, to selectively send one of: the first high voltage via the first lead, the second high voltage via the second lead, or simultaneously send the first and the second high voltage via the first and the second lead.

20. The switch matrix apparatus according to claim 19, comprises a corresponding precision impedance in the corresponding first and second switch network, respectively, for sampling the corresponding first and the second high voltage signals, and the corresponding first and second return signals.

21. The switch matrix apparatus according to claim 18, wherein the common voltage source apparatus comprises an internal common low voltage source coupled to a second low voltage lead of the switch matrix apparatus to a fourth terminal of the utility power device, the internal common low voltage source of the common voltage source outputs a common low voltage signal via the first low voltage lead of the switch matrix apparatus to the third terminal of the utility power device, wherein the internal common low voltage source and the internal common high voltage source each utilizes another switch network which is separate and different from the switch network for sending the first and second high voltage signals and for receiving the respective first and second corresponding signals returned via the first lead and the second lead of the switch matrix apparatus; and
simultaneously pass to the common voltage source apparatus, respective fifth electrical parameters across the third terminal and the fourth terminal of the utility power device returned via the second low voltage lead of the of the switch matrix apparatus which is connected to the fourth terminal of the utility power device, to the common voltage source apparatus for measurement.

22. The switch matrix apparatus according to claim 18, comprises one or more additional switch network and one or more additional leads from the switch matrix apparatus to send one or more additional high voltage signals to one or more additional terminals of the utility power device, or to receive a corresponding one or more additional return signals from the electrical utility power device in measuring a corresponding one or more additional electrical parameters.

23. The switch matrix apparatus according to claim 16, wherein another low voltage lead from the switch matrix apparatus is electrically coupled to a chassis ground of the utility power device.

24. The switch matrix apparatus according to claim 16, wherein the common high voltage source of the common voltage apparatus performs at least one of: ramping the high voltage signal over a frequency range covering 0 Hz (DC) to at least 1 KHz (AC), and ramping the high voltage signal over a voltage range covering 1 kV to at least 15 kV.

25. The switch matrix apparatus according to claim 16, wherein the electrical utility power device at least being one of: a power transformer, a current transformer, a switched capacitor bank, a circuit breaker, a recloser, a relay, a transformer bushing, a coupling capacitor or a surge arrester.

26. The switch matrix apparatus according to claim 16, wherein the electrical parameters comprise one or more of: current, voltage, phase, impedance, capacitance, transformer turns ratio (TTR), reactance leakage, dielectric loss, power factor, tan delta, load burden, partial discharge or arcing.

27. The switch matrix apparatus according to claim 16, wherein the corresponding first or the second return signals are selectively routed via one or more guard points of the switch matrix apparatus, wherein the one or more guard points are designated as signal return nodes internal to the switch matrix apparatus.

28. The switch matrix apparatus according to claim 16, wherein both the first lead and the second lead of the switch matrix apparatus are coupled to the internal common voltage source of the common voltage source apparatus, and the switch matrix apparatus simultaneously sends a high voltage signal via the first lead and the second lead to a first and a second terminal of the utility power device, and the corresponding first and the second return signals received via at least one or both of the first and a second low voltage leads which are coupled between at least one or both of the third and a fourth terminal of the utility power device to be measured by the common voltage source apparatus.

29. The switch matrix apparatus according to claim 16, wherein the switch matrix apparatus couples the one or more CVA ports to corresponding ports of two or more respective separate common voltage source apparatuses through respective communication interfaces, such that each of the two or more common voltage source apparatuses each simultaneously and independently communicates with and controls the switch matrix apparatus in order to perform multiple test measurements on the utility power device directly through the switch matrix apparatus.

30. The switch matrix apparatus according to claim 29, wherein the switch matrix apparatus simultaneously performs multiple test measurements on two or more respective utility power devices through controlling the switch matrix apparatus through the respective communication interfaces which are directly coupled to the two or more respective separate common voltage source apparatuses.

\* \* \* \* \*